(12) United States Patent
Strenz et al.

(10) Patent No.: US 8,320,191 B2
(45) Date of Patent: Nov. 27, 2012

(54) MEMORY CELL ARRANGEMENT, METHOD FOR CONTROLLING A MEMORY CELL, MEMORY ARRAY AND ELECTRONIC DEVICE

(75) Inventors: Robert Strenz, Radebeul (DE); Wolfram Langheinrich, Dresden (DE); Mayk Roehrich, Dresden (DE); Robert Wiesner, Bad Aibling (DE)

(73) Assignee: Infineon Technologies AG, Neubiberg (DE)

( * ) Notice: Subject to any disclaimer, the term of this patent is extended or adjusted under 35 U.S.C. 154(b) by 395 days.

(21) Appl. No.: 12/049,132

(22) Filed: Mar. 14, 2008

(65) Prior Publication Data

US 2009/0059678 A1   Mar. 5, 2009

Related U.S. Application Data

(60) Provisional application No. 60/975,884, filed on Sep. 28, 2007, provisional application No. 60/968,989, filed on Aug. 30, 2007.

(51) Int. Cl.
*G11C 16/04* (2006.01)
(52) U.S. Cl. ......... 365/185.27; 365/185.18; 365/185.28; 365/185.29
(58) Field of Classification Search .............. 365/185.18, 365/185.27, 185.28, 185.29
See application file for complete search history.

(56) References Cited

U.S. PATENT DOCUMENTS

| | | |
|---|---|---|
| 3,836,992 A | 9/1974 | Abbas et al. |
| 3,849,638 A | 11/1974 | Greer |
| 3,893,085 A | 7/1975 | Hansen |
| 3,952,325 A | 4/1976 | Beale et al. |
| 4,051,464 A | 9/1977 | Huang |
| 4,099,196 A | 7/1978 | Simko |
| 4,112,509 A | 9/1978 | Wall |
| 4,119,995 A | 10/1978 | Simko |
| 4,122,544 A | 10/1978 | McElroy |
| 4,130,900 A | 12/1978 | Watanabe |

(Continued)

FOREIGN PATENT DOCUMENTS

CN    1542853 A    11/2004

(Continued)

OTHER PUBLICATIONS

Wu, A.T., et al., "A Novel High-Speed, 5-Volt Programming EPROM Structure with Source-Side Injection," 1986 International Electron Devices Meeting, vol. 32, pp. 584-587, 6 pages, IEEE, Los Alamitos, CA.

(Continued)

*Primary Examiner* — Hoai V Ho
(74) *Attorney, Agent, or Firm* — Slater & Matsil, L.L.P.

(57) ABSTRACT

In an embodiment of the invention, a memory cell arrangement includes a substrate and at least one memory cell including a charge storing memory cell structure and a select structure. The memory cell arrangement further includes a first doping well, a second doping well and a third doping well arranged within the substrate, wherein the charge storing memory cell structure is arranged in or above the first doping well, the first doping well is arranged within the second doping well, and the second doping well is arranged within the third doping well. The memory cell arrangement further includes a control circuit coupled with the memory cell and configured to control the memory cell such that the charge storing memory cell structure is programmed or erased by charging or discharging the charge storing memory cell structure via at least the first doping well.

25 Claims, 12 Drawing Sheets

U.S. PATENT DOCUMENTS

| | | |
|---|---|---|
| 4,162,504 A | 7/1979 | Hsu |
| 4,185,319 A | 1/1980 | Stewart |
| 4,209,849 A | 6/1980 | Schrenk |
| 4,258,378 A | 3/1981 | Wall |
| 4,266,283 A | 5/1981 | Perlegos et al. |
| 4,274,012 A | 6/1981 | Simko |
| 4,288,863 A | 9/1981 | Adam |
| 4,297,719 A | 10/1981 | Hsu |
| 4,305,083 A | 12/1981 | Gutierrez |
| 4,314,265 A | 2/1982 | Simko |
| 4,317,110 A | 2/1982 | Hsu |
| 4,332,077 A | 6/1982 | Hsu |
| 4,336,603 A | 6/1982 | Kotecha et al. |
| 4,355,375 A | 10/1982 | Arakawa |
| 4,366,556 A | 12/1982 | Kyomasu et al. |
| 4,375,085 A | 2/1983 | Grise et al. |
| 4,375,087 A | 2/1983 | Wanlass |
| 4,398,338 A | 8/1983 | Tickle et al. |
| 4,399,523 A | 8/1983 | Gerber et al. |
| 4,417,264 A | 11/1983 | Angle |
| 4,425,631 A | 1/1984 | Adam |
| 4,429,326 A | 1/1984 | Watanabe et al. |
| 4,460,979 A | 7/1984 | Brahmbhatt |
| 4,462,090 A | 7/1984 | Iizuka |
| 4,479,203 A | 10/1984 | Kuo |
| 4,486,769 A | 12/1984 | Simko |
| 4,486,859 A | 12/1984 | Hoffman |
| 4,491,859 A | 1/1985 | Hijiya et al. |
| 4,493,058 A | 1/1985 | Adam |
| 4,513,397 A | 4/1985 | Ipri et al. |
| 4,524,429 A | 6/1985 | Giebel |
| 4,527,256 A | 7/1985 | Giebel |
| 4,527,258 A | 7/1985 | Guterman |
| 4,527,259 A | 7/1985 | Watanabe |
| 4,566,020 A | 1/1986 | Shannon |
| 4,577,215 A | 3/1986 | Stewart et al. |
| 4,577,295 A | 3/1986 | Eitan et al. |
| 4,599,706 A | 7/1986 | Guterman |
| 4,616,245 A | 10/1986 | Topich et al. |
| 4,617,652 A | 10/1986 | Simko |
| 4,630,086 A | 12/1986 | Sato et al. |
| 4,677,590 A | 6/1987 | Arakawa |
| 4,683,554 A | 7/1987 | Lockwood et al. |
| 4,725,983 A | 2/1988 | Terada |
| 4,742,491 A | 5/1988 | Liang et al. |
| 4,745,579 A | 5/1988 | Mead et al. |
| 4,752,912 A | 6/1988 | Guterman |
| 4,763,299 A | 8/1988 | Hazani |
| 4,769,788 A | 9/1988 | Poeppelman et al. |
| 4,794,564 A | 12/1988 | Watanabe |
| 4,794,565 A | 12/1988 | Wu et al. |
| 4,845,680 A | 7/1989 | Iwahashi |
| 4,861,730 A | 8/1989 | Hsia et al. |
| 4,862,238 A | 8/1989 | Shannon |
| 4,870,615 A | 9/1989 | Maruyama et al. |
| 4,888,734 A | 12/1989 | Lee et al. |
| 4,888,735 A | 12/1989 | Lee et al. |
| 4,905,063 A | 2/1990 | Beltram et al. |
| 4,907,197 A | 3/1990 | Uchida |
| 4,912,749 A | 3/1990 | Maruyama et al. |
| 4,930,105 A | 5/1990 | Matsumoto et al. |
| 4,943,943 A | 7/1990 | Hayashi et al. |
| 4,945,393 A | 7/1990 | Beltram et al. |
| 4,967,393 A | 10/1990 | Yokoyama et al. |
| 5,021,999 A | 6/1991 | Kohda et al. |
| 5,022,009 A | 6/1991 | Terada et al. |
| 5,040,036 A | 8/1991 | Hazani |
| 5,040,147 A | 8/1991 | Yoshizawa et al. |
| 5,042,009 A | 8/1991 | Kazerounian et al. |
| 5,047,814 A | 9/1991 | Hazani |
| 5,049,516 A | 9/1991 | Arima |
| 5,053,841 A | 10/1991 | Miyakawa et al. |
| 5,058,063 A | 10/1991 | Wada et al. |
| 5,073,513 A | 12/1991 | Lee |
| 5,087,583 A | 2/1992 | Hazani |
| 5,089,433 A | 2/1992 | Anand et al. |
| 5,091,326 A | 2/1992 | Haskell |
| 5,099,297 A | 3/1992 | Hazani |
| 5,099,451 A | 3/1992 | Sourgen et al. |
| 5,101,249 A | 3/1992 | Hijiya et al. |
| 5,105,386 A | 4/1992 | Andoh et al. |
| 5,120,571 A | 6/1992 | Gill et al. |
| 5,138,575 A | 8/1992 | Ema et al. |
| 5,140,133 A | 8/1992 | O'Brien et al. |
| 5,153,684 A | 10/1992 | Shoji et al. |
| 5,153,854 A | 10/1992 | Herold |
| 5,162,247 A | 11/1992 | Hazani |
| 5,166,900 A | 11/1992 | Kondo |
| 5,166,904 A | 11/1992 | Hazani |
| 5,170,373 A | 12/1992 | Doyle et al. |
| 5,177,705 A | 1/1993 | McElroy et al. |
| 5,182,725 A | 1/1993 | Andoh et al. |
| 5,210,048 A | 5/1993 | Shoji et al. |
| 5,218,568 A | 6/1993 | Lin et al. |
| 5,220,528 A | 6/1993 | Mielke |
| 5,231,041 A | 7/1993 | Arima et al. |
| 5,241,498 A | 8/1993 | Yokokura |
| 5,247,346 A | 9/1993 | Hazani |
| 5,251,169 A | 10/1993 | Josephson |
| 5,260,593 A | 11/1993 | Lee |
| 5,260,895 A | 11/1993 | Shishikura |
| 5,268,585 A | 12/1993 | Yamauchi |
| 5,278,785 A | 1/1994 | Hazani |
| 5,280,446 A | 1/1994 | Ma et al. |
| 5,283,758 A | 2/1994 | Nakayama et al. |
| 5,283,759 A | 2/1994 | Smith |
| 5,284,786 A | 2/1994 | Sethi |
| 5,293,328 A | 3/1994 | Amin et al. |
| 5,293,337 A | 3/1994 | Aritome et al. |
| 5,296,397 A | 3/1994 | Lee |
| 5,303,185 A | 4/1994 | Hazani |
| 5,304,505 A | 4/1994 | Hazani |
| 5,311,049 A | 5/1994 | Tsuruta |
| 5,324,676 A | 6/1994 | Guterman |
| 5,326,999 A | 7/1994 | Kim et al. |
| 5,329,487 A | 7/1994 | Gupta et al. |
| 5,332,914 A | 7/1994 | Hazani |
| 5,338,952 A | 8/1994 | Yamauchi |
| 5,359,218 A | 10/1994 | Taneda |
| 5,359,573 A | 10/1994 | Wang |
| 5,360,756 A | 11/1994 | Tamura |
| 5,401,991 A | 3/1995 | Imura |
| 5,402,371 A * | 3/1995 | Ono ..................... 365/185.07 |
| 5,402,373 A | 3/1995 | Aritome et al. |
| 5,414,286 A | 5/1995 | Yamauchi |
| 5,414,665 A | 5/1995 | Kodama |
| 5,430,675 A | 7/1995 | Yajima et al. |
| 5,432,740 A | 7/1995 | D'Arrigo et al. |
| 5,436,479 A | 7/1995 | Devin |
| 5,440,518 A | 8/1995 | Hazani |
| 5,442,589 A | 8/1995 | Kowalski |
| 5,455,792 A | 10/1995 | Yi |
| 5,455,793 A | 10/1995 | Amin et al. |
| 5,477,068 A | 12/1995 | Ozawa |
| 5,494,838 A | 2/1996 | Chang et al. |
| 5,514,607 A | 5/1996 | Taneda |
| 5,515,319 A * | 5/1996 | Smayling et al. ........ 365/185.27 |
| 5,523,970 A | 6/1996 | Riggio, Jr. |
| 5,528,547 A | 6/1996 | Aritome et al. |
| 5,544,103 A | 8/1996 | Lambertson |
| 5,557,569 A | 9/1996 | Smayling et al. |
| 5,559,735 A | 9/1996 | Ono et al. |
| 5,572,054 A | 11/1996 | Wang et al. |
| 5,608,676 A | 3/1997 | Medlock et al. |
| 5,610,858 A | 3/1997 | Iwahashi |
| 5,617,358 A | 4/1997 | Kodama |
| 5,621,683 A | 4/1997 | Young |
| 5,640,031 A | 6/1997 | Keshtbod |
| 5,640,346 A | 6/1997 | Preslar |
| 5,646,430 A | 7/1997 | Kaya et al. |
| 5,656,838 A | 8/1997 | Shinmori |
| 5,656,839 A | 8/1997 | Komori et al. |
| 5,666,307 A | 9/1997 | Chang |
| 5,666,309 A | 9/1997 | Peng et al. |
| 5,677,867 A | 10/1997 | Hazani |
| 5,677,871 A | 10/1997 | Pio et al. |
| 5,680,346 A | 10/1997 | Pathak et al. |

| | | | | | | |
|---|---|---|---|---|---|---|
| 5,691,939 A | 11/1997 | Chang et al. | | 6,128,223 A | 10/2000 | Sasai et al. |
| 5,706,227 A | 1/1998 | Chang et al. | | 6,134,144 A | 10/2000 | Lin et al. |
| 5,706,228 A | 1/1998 | Chang et al. | | 6,134,147 A | 10/2000 | Kaneda |
| 5,736,443 A | 4/1998 | Park et al. | | 6,136,652 A | 10/2000 | Hazani |
| 5,742,542 A | 4/1998 | Lin et al. | | 6,137,724 A | 10/2000 | Kalnitsky et al. |
| 5,753,953 A | 5/1998 | Fukumoto | | 6,141,250 A | 10/2000 | Kashimura |
| 5,776,787 A | 7/1998 | Keshtbod | | 6,144,586 A | 11/2000 | Van Houdt et al. |
| 5,784,327 A | 7/1998 | Hazani | | 6,147,912 A | 11/2000 | Kitazawa |
| 5,789,297 A | 8/1998 | Wang et al. | | 6,151,254 A | 11/2000 | Kanamori |
| 5,793,080 A | 8/1998 | Hwang | | 6,157,568 A | 12/2000 | Schmidt |
| 5,801,414 A | 9/1998 | Shinmori | | 6,157,569 A | 12/2000 | Nomura et al. |
| 5,812,452 A | 9/1998 | Hoang | | 6,157,574 A | 12/2000 | Kalnitsky et al. |
| 5,821,581 A | 10/1998 | Kaya et al. | | 6,166,786 A | 12/2000 | Ohkubo et al. |
| 5,822,259 A | 10/1998 | Maccarrone et al. | | 6,168,995 B1 | 1/2001 | Kelley et al. |
| 5,825,062 A | 10/1998 | Muramoto | | 6,169,307 B1 | 1/2001 | Takahashi et al. |
| 5,835,409 A | 11/1998 | Lambertson | | 6,171,908 B1 | 1/2001 | Chen |
| 5,841,161 A | 11/1998 | Lim et al. | | 6,181,607 B1 | 1/2001 | Lee et al. |
| 5,844,271 A | 12/1998 | Sethi et al. | | 6,184,088 B1 | 2/2001 | Kurooka et al. |
| 5,850,361 A | 12/1998 | Pascucci | | 6,184,554 B1 | 2/2001 | Chen |
| 5,856,688 A | 1/1999 | Lee et al. | | 6,185,133 B1 | 2/2001 | Chan et al. |
| 5,856,943 A | 1/1999 | Jeng | | 6,188,605 B1 | 2/2001 | Nomura et al. |
| 5,859,455 A | 1/1999 | Yu | | 6,195,285 B1 | 2/2001 | Yamamoto et al. |
| 5,862,076 A | 1/1999 | Eitan | | 6,195,293 B1 | 2/2001 | Yun et al. |
| 5,862,082 A | 1/1999 | Dejenfelt et al. | | 6,201,725 B1 | 3/2001 | Yao et al. |
| 5,874,759 A | 2/1999 | Park | | 6,208,559 B1 | 3/2001 | Tu et al. |
| 5,889,704 A | 3/1999 | McPartland | | 6,212,100 B1 | 4/2001 | Choi |
| 5,898,619 A | 4/1999 | Chang et al. | | 6,212,102 B1 | 4/2001 | Georgakos et al. |
| 5,898,630 A | 4/1999 | Madurawe | | 6,214,666 B1 | 4/2001 | Mehta |
| 5,912,840 A | 6/1999 | Gonzalez et al. | | 6,215,688 B1 | 4/2001 | Pio |
| 5,912,842 A | 6/1999 | Chang et al. | | 6,215,700 B1 | 4/2001 | Fong et al. |
| 5,912,844 A | 6/1999 | Chen et al. | | 6,222,759 B1 | 4/2001 | Chi-Hung |
| 5,914,514 A | 6/1999 | Dejenfelt et al. | | 6,232,180 B1 | 5/2001 | Chen |
| 5,918,125 A | 6/1999 | Guo et al. | | 6,232,185 B1 | 5/2001 | Wang |
| 5,943,261 A | 8/1999 | Lee | | 6,232,634 B1 | 5/2001 | Wu et al. |
| 5,949,706 A | 9/1999 | Chang et al. | | 6,236,595 B1 | 5/2001 | Gerber et al. |
| 5,952,691 A | 9/1999 | Yamaguchi | | 6,246,612 B1 | 6/2001 | Van Houdt et al. |
| 5,953,255 A | 9/1999 | Lee | | 6,252,270 B1 | 6/2001 | Gregor et al. |
| 5,963,476 A | 10/1999 | Hung et al. | | 6,261,907 B1 * | 7/2001 | Chang .......................... 438/266 |
| 5,963,478 A | 10/1999 | Sedlak | | 6,266,274 B1 | 7/2001 | Pockrandt et al. |
| 5,966,325 A | 10/1999 | Nakanishi et al. | | 6,271,091 B1 | 8/2001 | Park |
| 5,966,328 A | 10/1999 | Kobatake | | 6,271,560 B1 | 8/2001 | Kalnitsky et al. |
| 5,966,332 A | 10/1999 | Takano | | 6,275,413 B1 | 8/2001 | Naura |
| 5,969,992 A | 10/1999 | Mehta et al. | | 6,282,123 B1 | 8/2001 | Mehta |
| 5,978,253 A | 11/1999 | Lee et al. | | 6,282,124 B1 | 8/2001 | Van Houdt et al. |
| 5,978,272 A | 11/1999 | Fang et al. | | 6,284,601 B1 | 9/2001 | Hoang |
| 5,978,276 A | 11/1999 | Wong | | 6,285,589 B1 | 9/2001 | Kajitani |
| 5,981,340 A | 11/1999 | Chang et al. | | 6,288,938 B1 | 9/2001 | Park et al. |
| 5,986,931 A | 11/1999 | Caywood | | 6,291,297 B1 | 9/2001 | Chen |
| 5,986,941 A | 11/1999 | Pang et al. | | 6,291,855 B1 | 9/2001 | Chang et al. |
| 5,998,830 A | 12/1999 | Kwon | | 6,294,811 B1 | 9/2001 | Fong et al. |
| 6,005,807 A | 12/1999 | Chen | | 6,295,226 B1 | 9/2001 | Yang |
| 6,005,809 A | 12/1999 | Sung et al. | | 6,295,229 B1 | 9/2001 | Chang et al. |
| 6,011,717 A | 1/2000 | Brigati et al. | | 6,307,781 B1 | 10/2001 | Shum |
| 6,014,328 A | 1/2000 | Onakado et al. | | 6,307,784 B1 | 10/2001 | Hamilton et al. |
| 6,021,066 A | 2/2000 | Lam | | 6,307,807 B1 | 10/2001 | Sakui et al. |
| 6,025,229 A | 2/2000 | Hong | | 6,313,500 B1 | 11/2001 | Kelley et al. |
| 6,031,759 A | 2/2000 | Ohashi | | 6,314,022 B1 | 11/2001 | Kawata et al. |
| 6,032,248 A | 2/2000 | Curry et al. | | 6,323,089 B1 | 11/2001 | Kao et al. |
| 6,034,892 A | 3/2000 | Choi | | 6,323,515 B1 | 11/2001 | Yamazaki et al. |
| 6,034,896 A | 3/2000 | Ranaweera et al. | | 6,326,661 B1 | 12/2001 | Dormans et al. |
| 6,040,218 A | 3/2000 | Lam | | 6,331,721 B1 | 12/2001 | Sung et al. |
| 6,044,021 A | 3/2000 | Sedlak | | 6,344,994 B1 | 2/2002 | Hamilton et al. |
| 6,057,197 A | 5/2000 | Sung | | 6,348,711 B1 | 2/2002 | Eitan |
| 6,057,575 A | 5/2000 | Jenq | | 6,349,061 B1 | 2/2002 | Yoneyama et al. |
| 6,058,043 A | 5/2000 | Houdt et al. | | 6,362,046 B1 | 3/2002 | Arai |
| 6,064,595 A | 5/2000 | Logie et al. | | 6,368,918 B2 | 4/2002 | Cunningham et al. |
| 6,067,252 A | 5/2000 | Ma | | 6,372,568 B1 | 4/2002 | Strenz |
| 6,087,695 A | 7/2000 | Chen | | 6,377,490 B1 | 4/2002 | Takahashi et al. |
| 6,091,638 A | 7/2000 | Chang | | 6,381,173 B1 | 4/2002 | Zatelli |
| 6,097,631 A | 8/2000 | Guedj | | 6,388,922 B1 | 5/2002 | Fujiwara et al. |
| 6,104,057 A | 8/2000 | Nakanishi et al. | | 6,392,927 B2 | 5/2002 | Yamauchi |
| 6,107,141 A | 8/2000 | Hsu et al. | | 6,414,350 B1 | 7/2002 | Hsieh et al. |
| 6,111,287 A | 8/2000 | Arai | | 6,414,872 B1 | 7/2002 | Bergemont et al. |
| 6,115,315 A | 9/2000 | Yoshida | | 6,418,062 B1 | 7/2002 | Hayashi et al. |
| 6,121,087 A | 9/2000 | Mann et al. | | 6,420,232 B1 | 7/2002 | Wu |
| 6,125,060 A | 9/2000 | Chang | | 6,426,897 B1 | 7/2002 | Jung et al. |
| 6,128,219 A | 10/2000 | Pio et al. | | 6,433,382 B1 | 8/2002 | Orlowski et al. |
| 6,128,220 A | 10/2000 | Banyai et al. | | 6,438,028 B1 | 8/2002 | Kobayashi et al. |
| 6,128,222 A | 10/2000 | Moreaux | | 6,442,074 B1 | 8/2002 | Hamilton et al. |

| | | |
|---|---|---|
| 6,448,138 B1 | 9/2002 | Clementi et al. |
| 6,459,615 B1 | 10/2002 | McPartland et al. |
| 6,459,616 B1 | 10/2002 | Beauchamp et al. |
| 6,476,440 B1 | 11/2002 | Shin |
| 6,486,509 B1 | 11/2002 | Van Houdt |
| 6,493,261 B1 | 12/2002 | Hamilton et al. |
| 6,493,262 B1 | 12/2002 | Wald et al. |
| 6,493,264 B2 | 12/2002 | Yamauchi |
| 6,504,207 B1 | 1/2003 | Chen et al. |
| 6,512,696 B1 | 1/2003 | Fan et al. |
| 6,512,701 B1 | 1/2003 | Hamilton et al. |
| 6,515,899 B1 | 2/2003 | Tu et al. |
| 6,528,843 B1 | 3/2003 | Wu |
| 6,529,441 B1 | 3/2003 | Cummins et al. |
| 6,535,431 B1 | 3/2003 | Pio et al. |
| 6,555,870 B1 | 4/2003 | Kirisawa |
| 6,556,481 B1 * | 4/2003 | Hsu et al. ................. 365/185.24 |
| 6,614,694 B1 | 9/2003 | Yeh et al. |
| 6,621,736 B1 | 9/2003 | Mirgorodski et al. |
| 6,624,029 B2 | 9/2003 | Lojek et al. |
| 6,630,381 B1 | 10/2003 | Hazani |
| 6,635,533 B1 | 10/2003 | Chang et al. |
| 6,653,682 B1 | 11/2003 | Houdt et al. |
| 6,687,162 B1 | 2/2004 | Hsueh et al. |
| 6,693,830 B1 | 2/2004 | Hu et al. |
| 6,703,662 B1 | 3/2004 | Koishikawa |
| 6,710,396 B1 | 3/2004 | Wu |
| 6,711,063 B1 | 3/2004 | Dejenfelt et al. |
| 6,721,204 B1 * | 4/2004 | Yeh et al. ................. 365/185.24 |
| 6,744,664 B1 | 6/2004 | Wu |
| 6,756,632 B1 | 6/2004 | Chen et al. |
| 6,757,196 B1 | 6/2004 | Tsao et al. |
| 6,798,012 B1 | 9/2004 | Ma et al. |
| 6,816,414 B1 | 11/2004 | Prinz |
| 6,819,594 B2 | 11/2004 | Lee et al. |
| 6,828,194 B2 | 12/2004 | Chan et al. |
| 6,828,623 B1 | 12/2004 | Guo et al. |
| 6,830,963 B1 | 12/2004 | Forbes |
| 6,831,326 B1 | 12/2004 | Hsieh |
| 6,833,582 B2 | 12/2004 | Mine et al. |
| 6,835,979 B1 | 12/2004 | Liu et al. |
| 6,838,342 B1 | 1/2005 | Ding |
| 6,842,370 B2 | 1/2005 | Forbes |
| 6,842,372 B1 | 1/2005 | Hu |
| 6,842,374 B2 | 1/2005 | Lee et al. |
| 6,847,556 B2 | 1/2005 | Cho |
| 6,873,550 B2 | 3/2005 | Mihnea |
| 6,878,588 B2 | 4/2005 | Dong et al. |
| 6,878,991 B1 | 4/2005 | Forbes |
| 6,894,932 B1 | 5/2005 | Melik-Martirosian et al. |
| 6,897,515 B2 | 5/2005 | Fujiwara |
| 6,901,006 B1 | 5/2005 | Kobayashi et al. |
| 6,901,010 B1 | 5/2005 | Hamilton et al. |
| 6,903,407 B1 | 6/2005 | Kang |
| 6,920,067 B2 | 7/2005 | Hsu et al. |
| 6,934,190 B1 | 8/2005 | Liu et al. |
| 6,937,514 B2 | 8/2005 | Hasegawa |
| 6,952,366 B2 | 10/2005 | Forbes |
| 6,977,412 B2 | 12/2005 | Smith |
| 6,979,856 B2 | 12/2005 | Nishizaka et al. |
| 6,979,857 B2 | 12/2005 | Forbes |
| 6,992,927 B1 | 1/2006 | Poplevine et al. |
| 7,002,865 B2 | 2/2006 | Agata et al. |
| 7,009,888 B2 | 3/2006 | Masuoka et al. |
| 7,020,018 B2 * | 3/2006 | Hsieh et al. ............. 365/185.03 |
| 7,023,732 B2 | 4/2006 | Sekimoto et al. |
| 7,072,217 B2 | 7/2006 | Prall |
| 7,075,127 B2 | 7/2006 | Kothandaraman et al. |
| 7,075,140 B2 | 7/2006 | Spadea |
| 7,075,146 B2 | 7/2006 | Forbes |
| 7,075,831 B2 | 7/2006 | Mihnea et al. |
| 7,102,188 B1 | 9/2006 | Yao et al. |
| 7,102,191 B2 | 9/2006 | Forbes |
| 7,106,629 B2 | 9/2006 | Chu et al. |
| 7,113,431 B1 | 9/2006 | Hamilton et al. |
| 7,115,470 B2 | 10/2006 | Park et al. |
| 7,115,943 B2 | 10/2006 | Mine et al. |
| 7,116,583 B2 * | 10/2006 | Sander et al. ............ 365/185.28 |
| 7,157,769 B2 | 1/2007 | Forbes |
| 7,160,777 B2 | 1/2007 | Choi et al. |
| 7,167,398 B1 | 1/2007 | Liu et al. |
| 7,184,315 B2 | 2/2007 | Forbes |
| 7,184,316 B2 | 2/2007 | Cho et al. |
| 7,202,523 B2 | 4/2007 | Forbes |
| 7,211,487 B2 | 5/2007 | Chindalore et al. |
| 7,211,858 B2 | 5/2007 | Prinz |
| 7,220,634 B2 | 5/2007 | Prall et al. |
| 7,221,018 B2 | 5/2007 | Forbes |
| 7,236,398 B1 | 6/2007 | Smolen et al. |
| 7,241,654 B2 | 7/2007 | Forbes |
| 7,242,613 B2 | 7/2007 | Sakui et al. |
| 7,289,365 B2 | 10/2007 | Shuto |
| 7,304,350 B2 | 12/2007 | Misaki |
| 7,315,058 B2 | 1/2008 | Hikita |
| 7,339,827 B2 | 3/2008 | Yasui et al. |
| 7,339,833 B2 | 3/2008 | Jono et al. |
| 7,342,833 B2 | 3/2008 | Cavins et al. |
| 7,355,327 B2 | 4/2008 | Kimura et al. |
| 7,365,387 B2 | 4/2008 | Benjamin |
| 7,393,748 B2 | 7/2008 | Arai et al. |
| 7,414,889 B2 | 8/2008 | Lue et al. |
| 7,439,782 B2 | 10/2008 | Kamoshida |
| 7,453,117 B2 | 11/2008 | Sudo et al. |
| 7,468,913 B2 | 12/2008 | Kawamura et al. |
| 7,482,660 B2 | 1/2009 | Osari |
| 7,486,565 B2 | 2/2009 | Edahiro |
| 7,505,325 B2 | 3/2009 | Chang |
| 7,508,852 B2 | 3/2009 | Arahira |
| 7,515,467 B2 | 4/2009 | Yuda |
| 7,525,844 B2 | 4/2009 | Edahiro |
| 7,528,436 B2 | 5/2009 | Georgescu et al. |
| 7,542,349 B2 | 6/2009 | Rai et al. |
| 7,544,980 B2 | 6/2009 | Chindalore et al. |
| 7,551,491 B2 | 6/2009 | Kim et al. |
| 7,557,008 B2 | 7/2009 | Rao et al. |
| 7,590,000 B2 | 9/2009 | McCollum et al. |
| 7,592,221 B2 | 9/2009 | Kanamori |
| 7,598,561 B2 | 10/2009 | Chen et al. |
| 7,619,278 B2 | 11/2009 | Kuboyama et al. |
| 7,663,916 B2 | 2/2010 | Chih et al. |
| 7,671,399 B2 | 3/2010 | Sudo et al. |
| 7,721,703 B2 | 5/2010 | Kakuho et al. |
| 7,728,378 B2 | 6/2010 | Ueda et al. |
| 7,750,393 B2 | 7/2010 | Kim et al. |
| 7,787,290 B2 | 8/2010 | Takemura et al. |
| 7,813,180 B2 | 10/2010 | Kim et al. |
| 7,817,468 B2 | 10/2010 | Isobe et al. |
| 7,884,416 B2 | 2/2011 | Watanabe et al. |
| 7,888,209 B2 | 2/2011 | Nansei |
| 7,889,549 B2 | 2/2011 | Saitou |
| 7,915,666 B2 | 3/2011 | Yasui et al. |
| 7,939,890 B2 | 5/2011 | Yamauchi |
| 2001/0003366 A1 | 6/2001 | Hayashi |
| 2001/0004325 A1 | 6/2001 | Choi |
| 2001/0019506 A1 | 9/2001 | Chen |
| 2001/0022359 A1 | 9/2001 | Mehta |
| 2001/0024394 A1 | 9/2001 | Kim |
| 2001/0026480 A1 | 10/2001 | Chang |
| 2001/0030341 A1 | 10/2001 | Verhaar |
| 2002/0000606 A1 | 1/2002 | Eitan |
| 2002/0011621 A1 | 1/2002 | Takasu |
| 2002/0021587 A1 | 2/2002 | Sakui |
| 2002/0031018 A1 | 3/2002 | Noro |
| 2002/0043682 A1 | 4/2002 | Yamazaki |
| 2002/0050610 A1 | 5/2002 | Dray |
| 2002/0057600 A1 | 5/2002 | Sakui |
| 2002/0064071 A1 * | 5/2002 | Takahashi et al. ....... 365/185.29 |
| 2002/0067641 A1 | 6/2002 | Ogura |
| 2002/0071308 A1 | 6/2002 | Muranaka |
| 2002/0089013 A1 | 7/2002 | Arai |
| 2002/0089877 A1 | 7/2002 | Yi |
| 2002/0089878 A1 | 7/2002 | Park |
| 2002/0100926 A1 | 8/2002 | Kim |
| 2002/0114185 A1 | 8/2002 | Blyth |
| 2002/0131299 A1 | 9/2002 | Yamazoe |
| 2002/0131304 A1 | 9/2002 | Ogura |
| 2002/0136058 A1 | 9/2002 | Hsu |
| 2002/0137290 A1 | 9/2002 | Wils |

| | | | | | | |
|---|---|---|---|---|---|---|
| 2002/0145159 A1 | 10/2002 | Ishii | | 2004/0152268 A1 | 8/2004 | Chu |
| 2002/0145915 A1 | 10/2002 | Ogura | | 2004/0175885 A1 | 9/2004 | Schmitz |
| 2002/0146883 A1 | 10/2002 | Furuhata | | 2004/0175886 A1 | 9/2004 | Slotboom |
| 2002/0158285 A1 | 10/2002 | Clementi | | 2004/0178456 A1 | 9/2004 | Park |
| 2002/0159293 A1 | 10/2002 | Hamilton | | 2004/0183122 A1 | 9/2004 | Mine |
| 2002/0163832 A1 | 11/2002 | Bertrand | | 2004/0195589 A1 | 10/2004 | Hsu |
| 2002/0163838 A1 | 11/2002 | Guterman | | 2004/0196698 A1 | 10/2004 | Hsu |
| 2002/0168818 A1 | 11/2002 | Bergemont | | 2004/0201059 A1 | 10/2004 | Ding |
| 2002/0175353 A1 | 11/2002 | Dray | | 2004/0207025 A1 | 10/2004 | Chiba |
| 2002/0175394 A1 | 11/2002 | Wu | | 2004/0212008 A1 | 10/2004 | Hasegawa |
| 2002/0176286 A1 | 11/2002 | Bergemont | | 2004/0212023 A1 | 10/2004 | Umezawa |
| 2002/0179965 A1 | 12/2002 | Kim | | 2004/0228181 A1 | 11/2004 | Maemura |
| 2002/0179977 A1* | 12/2002 | Wong et al. ............ 257/371 | | 2004/0232473 A1 | 11/2004 | Hsu |
| 2002/0181287 A1 | 12/2002 | Hsu | | 2004/0235249 A1 | 11/2004 | Schaijk |
| 2002/0182807 A1 | 12/2002 | Dormans | | 2004/0238974 A1 | 12/2004 | Baik |
| 2002/0190307 A1 | 12/2002 | Tuan | | 2004/0256653 A1 | 12/2004 | Iwata |
| 2002/0191439 A1 | 12/2002 | Caywood | | 2004/0256657 A1 | 12/2004 | Hung |
| 2002/0191458 A1 | 12/2002 | Kobayashi | | 2004/0259310 A1 | 12/2004 | Chang |
| 2003/0012054 A1 | 1/2003 | Kim | | 2004/0262668 A1 | 12/2004 | Wang |
| 2003/0013255 A1 | 1/2003 | Lojek | | 2004/0264227 A1 | 12/2004 | Kojima |
| 2003/0016555 A1 | 1/2003 | Kubota | | 2005/0002235 A1 | 1/2005 | Kaneda |
| 2003/0022441 A1 | 1/2003 | Ogura | | 2005/0006691 A1 | 1/2005 | Wu |
| 2003/0034517 A1 | 2/2003 | Chen | | 2005/0017287 A1 | 1/2005 | Chih |
| 2003/0035329 A1 | 2/2003 | Tailliet | | 2005/0018504 A1 | 1/2005 | Marinelli |
| 2003/0039146 A1 | 2/2003 | Choi | | 2005/0029580 A1 | 2/2005 | Kim |
| 2003/0048661 A1 | 3/2003 | Sakui | | 2005/0030793 A1 | 2/2005 | Hsu |
| 2003/0053347 A1 | 3/2003 | Wang | | 2005/0041475 A1 | 2/2005 | Park |
| 2003/0054609 A1 | 3/2003 | Kobayashi | | 2005/0042826 A1 | 2/2005 | Chang |
| 2003/0071301 A1 | 4/2003 | Wald | | 2005/0047213 A1 | 3/2005 | Umezawa |
| 2003/0081460 A1 | 5/2003 | Choi | | 2005/0048718 A1 | 3/2005 | Ahn |
| 2003/0086296 A1 | 5/2003 | Wu | | 2005/0052918 A1 | 3/2005 | Dormans |
| 2003/0095436 A1 | 5/2003 | Hoang | | 2005/0057971 A1 | 3/2005 | Hsieh |
| 2003/0109099 A1 | 6/2003 | Georgakos | | 2005/0062091 A1 | 3/2005 | Ding |
| 2003/0116789 A1 | 6/2003 | Noro | | 2005/0062096 A1 | 3/2005 | Sasago |
| 2003/0119213 A1 | 6/2003 | Chou | | 2005/0073001 A1 | 4/2005 | Kamigaichi |
| 2003/0127684 A1 | 7/2003 | Yoo | | 2005/0078527 A1 | 4/2005 | Liu |
| 2003/0137063 A1 | 7/2003 | Song | | 2005/0083738 A1 | 4/2005 | Huang |
| 2003/0141538 A1 | 7/2003 | Hayashi | | 2005/0083744 A1 | 4/2005 | Arai |
| 2003/0142549 A1 | 7/2003 | Rowlandson | | 2005/0085181 A1 | 4/2005 | Tao |
| 2003/0161184 A1 | 8/2003 | Lee | | 2005/0087794 A1 | 4/2005 | Chen |
| 2003/0189858 A1 | 10/2003 | Sowards | | 2005/0087796 A1 | 4/2005 | Jung |
| 2003/0189864 A1 | 10/2003 | Sim | | 2005/0088879 A1 | 4/2005 | Kim |
| 2003/0201467 A1 | 10/2003 | Liu | | 2005/0099847 A1 | 5/2005 | Ichige |
| 2003/0208663 A1 | 11/2003 | Van Buskirk | | 2005/0099849 A1 | 5/2005 | Lutze |
| 2003/0211689 A1 | 11/2003 | Yoo | | 2005/0101080 A1 | 5/2005 | Choi |
| 2003/0218203 A1 | 11/2003 | Hsieh | | 2005/0105332 A1 | 5/2005 | Shih |
| 2003/0218911 A1 | 11/2003 | Terzioglu | | 2005/0111258 A1 | 5/2005 | Terzioglu |
| 2003/0218913 A1 | 11/2003 | Le | | 2005/0111262 A1 | 5/2005 | Huang |
| 2003/0230775 A1 | 12/2003 | Chang | | 2005/0117419 A1 | 6/2005 | Hoshino |
| 2003/0235083 A1 | 12/2003 | Swift | | 2005/0122778 A1 | 6/2005 | Pio |
| 2004/0000688 A1 | 1/2004 | Harari | | 2005/0127429 A1 | 6/2005 | Otsuga |
| 2004/0000689 A1 | 1/2004 | Lai | | 2005/0135155 A1 | 6/2005 | Ishimaru |
| 2004/0007732 A1 | 1/2004 | Wong | | 2005/0141277 A1 | 6/2005 | Furuyama |
| 2004/0014274 A1 | 1/2004 | Wils | | 2005/0141281 A1 | 6/2005 | Jung |
| 2004/0014284 A1 | 1/2004 | Kim | | 2005/0145924 A1 | 7/2005 | Liu |
| 2004/0031853 A1 | 2/2004 | Peng | | 2005/0145927 A1 | 7/2005 | Hsu |
| 2004/0031986 A1 | 2/2004 | Yamazaki | | 2005/0145929 A1 | 7/2005 | Wu |
| 2004/0032763 A1 | 2/2004 | Chung | | 2005/0146937 A1 | 7/2005 | Fan |
| 2004/0032788 A1 | 2/2004 | Sakui | | 2005/0161729 A1 | 7/2005 | Dong |
| 2004/0041203 A1 | 3/2004 | Kim | | 2005/0162885 A1 | 7/2005 | Kanamitsu |
| 2004/0046204 A1 | 3/2004 | Choi | | 2005/0164451 A1 | 7/2005 | Ogura |
| 2004/0046210 A1 | 3/2004 | Kang | | 2005/0169052 A1 | 8/2005 | Hsu |
| 2004/0048432 A1 | 3/2004 | Na | | 2005/0170586 A1 | 8/2005 | Choi |
| 2004/0061168 A1 | 4/2004 | Cappelletti et al. | | 2005/0174851 A1 | 8/2005 | Ding |
| 2004/0062118 A1* | 4/2004 | Chindalore | | 2005/0180214 A1 | 8/2005 | Park |
| 2004/0063283 A1 | 4/2004 | Guterman | | 2005/0184330 A1 | 8/2005 | Ding |
| 2004/0065917 A1 | 4/2004 | Fan | | 2005/0184332 A1 | 8/2005 | Hirooka |
| 2004/0071011 A1 | 4/2004 | Nishizaka | | 2005/0190595 A1 | 9/2005 | Chu |
| 2004/0071020 A1 | 4/2004 | Chang | | 2005/0196913 A1 | 9/2005 | Hsiao et al. |
| 2004/0080012 A1 | 4/2004 | Kim | | 2005/0199938 A1 | 9/2005 | Sakuma |
| 2004/0084710 A1 | 5/2004 | Baker, Jr. | | 2005/0212034 A1 | 9/2005 | Sasago |
| 2004/0095808 A1 | 5/2004 | Kurata | | 2005/0213386 A1 | 9/2005 | Levi |
| 2004/0105319 A1 | 6/2004 | Jeng | | 2005/0213418 A1 | 9/2005 | Oga |
| 2004/0109364 A1 | 6/2004 | Yang | | 2005/0219900 A1 | 10/2005 | Kamigaki |
| 2004/0129971 A1 | 7/2004 | Owen | | 2005/0219913 A1 | 10/2005 | Choi |
| 2004/0129985 A1 | 7/2004 | Lee | | 2005/0219914 A1 | 10/2005 | Sarin |
| 2004/0130945 A1 | 7/2004 | Sim | | 2005/0219923 A1 | 10/2005 | Eneland |
| 2004/0132250 A1 | 7/2004 | Hazani | | 2005/0224858 A1 | 10/2005 | Hung et al. |
| 2004/0136240 A1 | 7/2004 | Zheng | | 2005/0224862 A1 | 10/2005 | Iino |

| | | | | | | |
|---|---|---|---|---|---|---|
| 2005/0224894 A1 | 10/2005 | Ichige | | 2006/0193167 A1 | 8/2006 | Hoefler |
| 2005/0226053 A1 | 10/2005 | Takikawa | | 2006/0197144 A1 | 9/2006 | Thomas |
| 2005/0227437 A1 | 10/2005 | Dong | | 2006/0198189 A1 | 9/2006 | Lue |
| 2005/0230736 A1 | 10/2005 | Ishimaru | | 2006/0199336 A1 | 9/2006 | Kang |
| 2005/0232016 A1 | 10/2005 | Hung | | 2006/0202255 A1 | 9/2006 | Jeon |
| 2005/0237801 A1 | 10/2005 | Shih | | 2006/0203543 A1 | 9/2006 | Jeong |
| 2005/0237808 A1 | 10/2005 | Ichikawa | | 2006/0203552 A1 | 9/2006 | Chen |
| 2005/0237817 A1 | 10/2005 | Umezawa | | 2006/0215460 A1 | 9/2006 | Liu |
| 2005/0237842 A1 | 10/2005 | Takeuchi | | 2006/0220100 A1 | 10/2006 | Tanaka |
| 2005/0239245 A1 | 10/2005 | Yamauchi | | 2006/0221682 A1 | 10/2006 | Chih |
| 2005/0243594 A1 | 11/2005 | Sander | | 2006/0227608 A1 | 10/2006 | Lusky |
| 2005/0243601 A1 | 11/2005 | Harari | | 2006/0234456 A1 | 10/2006 | Anderson |
| 2005/0243603 A1 | 11/2005 | Kobayashi | | 2006/0240617 A1 | 10/2006 | Torii |
| 2005/0245031 A1 | 11/2005 | Jeon | | 2006/0240653 A1 | 10/2006 | Bhattacharyya |
| 2005/0248984 A1 | 11/2005 | Ogura | | 2006/0244043 A1 | 11/2006 | Wang |
| 2005/0253182 A1 | 11/2005 | Hung | | 2006/0245233 A1 | 11/2006 | Mikolajick |
| 2005/0253184 A1 | 11/2005 | Hung | | 2006/0245263 A1 | 11/2006 | Sakui |
| 2005/0258473 A1 | 11/2005 | Yoshida | | 2006/0250844 A1 | 11/2006 | Lee |
| 2005/0265077 A1 | 12/2005 | Lee | | 2006/0250847 A1 | 11/2006 | Campardo |
| 2005/0269622 A1 | 12/2005 | Klinger | | 2006/0261399 A1 | 11/2006 | Widjaja |
| 2005/0270851 A1 | 12/2005 | Kato | | 2006/0261400 A1 | 11/2006 | Sudo |
| 2005/0272205 A1 | 12/2005 | Ding | | 2006/0262603 A1 | 11/2006 | La Rosa |
| 2005/0275002 A1 | 12/2005 | Shone | | 2006/0273374 A1 | 12/2006 | Kobayashi |
| 2005/0276106 A1 | 12/2005 | Chen | | 2006/0275986 A1 | 12/2006 | Kobayashi |
| 2005/0281087 A1 | 12/2005 | Shirota | | 2006/0278915 A1 | 12/2006 | Lee |
| 2005/0281092 A1 | 12/2005 | Lindsay | | 2006/0279997 A1 | 12/2006 | Hsu |
| 2005/0281125 A1 | 12/2005 | Chung | | 2006/0281260 A1 | 12/2006 | Lue |
| 2005/0282332 A1 | 12/2005 | Hsu | | 2006/0284239 A1 | 12/2006 | Park |
| 2005/0285178 A1 | 12/2005 | Abbott | | 2006/0284240 A1 | 12/2006 | Hsieh |
| 2005/0286303 A1 | 12/2005 | Mirabel | | 2006/0284243 A1 | 12/2006 | Hsu |
| 2005/0286312 A1 | 12/2005 | Wu | | 2006/0292792 A1 | 12/2006 | Van Schaijk |
| 2006/0007724 A1 | 1/2006 | Lee | | 2007/0001218 A1 | 1/2007 | Hong |
| 2006/0007732 A1 | 1/2006 | Yeh | | 2007/0002645 A1 | 1/2007 | Roehr |
| 2006/0011967 A1 | 1/2006 | Shone | | 2007/0004135 A1 | 1/2007 | Chindalore |
| 2006/0011971 A1 | 1/2006 | Hara | | 2007/0004142 A1 | 1/2007 | Shone |
| 2006/0013032 A1 | 1/2006 | Kurata | | 2007/0007575 A1 | 1/2007 | Ding |
| 2006/0018161 A1 | 1/2006 | Chen | | 2007/0007581 A1 | 1/2007 | Chen |
| 2006/0019445 A1 | 1/2006 | Chen | | 2007/0015331 A1 | 1/2007 | Forbes |
| 2006/0022253 A1 | 2/2006 | Anderson | | 2007/0018221 A1 | 1/2007 | Swift |
| 2006/0023506 A1 | 2/2006 | Jung | | 2007/0018222 A1 | 1/2007 | Sadd |
| 2006/0023509 A1 | 2/2006 | Kodaira | | 2007/0018232 A1 | 1/2007 | Chindalore |
| 2006/0024887 A1 | 2/2006 | Wong | | 2007/0018240 A1 | 1/2007 | Chindalore |
| 2006/0027853 A1 | 2/2006 | Kanamori | | 2007/0020820 A1 | 1/2007 | Chindalore |
| 2006/0030105 A1 | 2/2006 | Prinz | | 2007/0020831 A1 | 1/2007 | Chindalore |
| 2006/0033146 A1* | 2/2006 | Wang ............................ 257/315 | | 2007/0020845 A1 | 1/2007 | Swift |
| 2006/0040440 A1 | 2/2006 | Chen | | 2007/0020853 A1 | 1/2007 | Gao |
| 2006/0044876 A1 | 3/2006 | Shone | | 2007/0020856 A1 | 1/2007 | Sadd |
| 2006/0049451 A1 | 3/2006 | Georgescu | | 2007/0023820 A1 | 2/2007 | Yang |
| 2006/0050557 A1 | 3/2006 | Ishimaru | | 2007/0025153 A1 | 2/2007 | Wu |
| 2006/0062069 A1 | 3/2006 | Jeon | | 2007/0029625 A1 | 2/2007 | Lue |
| 2006/0073702 A1 | 4/2006 | Shone | | 2007/0032018 A1 | 2/2007 | Tuntasood |
| 2006/0076607 A1 | 4/2006 | Kang | | 2007/0034934 A1 | 2/2007 | Arai |
| 2006/0083045 A1 | 4/2006 | Kamoshida | | 2007/0034935 A1 | 2/2007 | Haraguchi |
| 2006/0083066 A1 | 4/2006 | Hasegawa | | 2007/0034936 A1 | 2/2007 | Van Schaijk |
| 2006/0083072 A1 | 4/2006 | Umezawa | | 2007/0036003 A1 | 2/2007 | Bae |
| 2006/0086970 A1 | 4/2006 | Kim | | 2007/0045716 A1 | 3/2007 | Chen |
| 2006/0098505 A1 | 5/2006 | Cho | | 2007/0054448 A1 | 3/2007 | Choi |
| 2006/0108628 A1 | 5/2006 | Hung | | 2007/0054452 A1 | 3/2007 | Hong |
| 2006/0109713 A1 | 5/2006 | Cheng | | 2007/0057031 A1 | 3/2007 | Lee |
| 2006/0118854 A1* | 6/2006 | Lee ............................... 257/315 | | 2007/0058440 A1 | 3/2007 | Lu |
| 2006/0118856 A1 | 6/2006 | Lojek | | 2007/0063262 A1 | 3/2007 | Violette |
| 2006/0120155 A1 | 6/2006 | Sato | | 2007/0064488 A1 | 3/2007 | Tanaka |
| 2006/0131633 A1 | 6/2006 | Bhattacharyya | | 2007/0066083 A1 | 3/2007 | Yang |
| 2006/0131639 A1 | 6/2006 | Jenq | | 2007/0069275 A1 | 3/2007 | Tsui |
| 2006/0133151 A1 | 6/2006 | Oberhuber | | 2007/0076490 A1 | 4/2007 | Kurata |
| 2006/0138534 A1 | 6/2006 | Kim | | 2007/0077754 A1 | 4/2007 | Ngo |
| 2006/0158940 A1 | 7/2006 | Shappir | | 2007/0085132 A1 | 4/2007 | Sanada |
| 2006/0160286 A1 | 7/2006 | Hwang | | 2007/0087482 A1 | 4/2007 | Yeh |
| 2006/0163642 A1 | 7/2006 | Widdershoven et al. | | 2007/0087550 A1 | 4/2007 | Chaudhry |
| 2006/0166420 A1 | 7/2006 | Van Duuren | | 2007/0093024 A1 | 4/2007 | Fu |
| 2006/0166441 A1 | 7/2006 | Yoo | | 2007/0099381 A1 | 5/2007 | Walker |
| 2006/0170026 A1 | 8/2006 | Wong | | 2007/0108503 A1 | 5/2007 | Chen |
| 2006/0170028 A1 | 8/2006 | Jeon | | 2007/0108507 A1 | 5/2007 | Wang |
| 2006/0172491 A1 | 8/2006 | Chen | | 2007/0109870 A1 | 5/2007 | Kurata |
| 2006/0180853 A1 | 8/2006 | Ryu | | 2007/0111451 A1 | 5/2007 | Kim |
| 2006/0186459 A1 | 8/2006 | Chang | | 2007/0120173 A1 | 5/2007 | Lojek |
| 2006/0186463 A1 | 8/2006 | Sasago | | 2007/0126050 A1 | 6/2007 | Kim |
| 2006/0186481 A1* | 8/2006 | Yang et al. ................. 257/371 | | 2007/0128815 A1 | 6/2007 | Iino |
| 2006/0190644 A1* | 8/2006 | Fallon ............................ 710/68 | | 2007/0132001 A1 | 6/2007 | Wang |

| | | | | | | |
|---|---|---|---|---|---|---|
| 2007/0132002 A1 | 6/2007 | Chan | | 2008/0084744 A1 | 4/2008 | Klinger |
| 2007/0132007 A1 | 6/2007 | Kamigaichi | | 2008/0096327 A1 | 4/2008 | Lee |
| 2007/0133283 A1 | 6/2007 | Sakui | | 2008/0099789 A1 | 5/2008 | Kotov |
| 2007/0133306 A1 | 6/2007 | Wang | | 2008/0111181 A1 | 5/2008 | Park |
| 2007/0133307 A1 | 6/2007 | Hsu | | 2008/0112225 A1 | 5/2008 | Benjamin |
| 2007/0134855 A1 | 6/2007 | Lai | | 2008/0114203 A1 | 5/2008 | Crank |
| 2007/0134876 A1 | 6/2007 | Lai | | 2008/0115408 A1 | 5/2008 | Pallmann |
| 2007/0138539 A1 | 6/2007 | Wu | | 2008/0123416 A1 | 5/2008 | Chih |
| 2007/0138541 A1 | 6/2007 | Chae | | 2008/0125712 A1 | 5/2008 | Dacquay |
| 2007/0140008 A1 | 6/2007 | Shields | | 2008/0142869 A1 | 6/2008 | Jang |
| 2007/0145165 A1 | 6/2007 | Murakami | | 2008/0149997 A1 | 6/2008 | Jin |
| 2007/0147123 A1 | 6/2007 | Yoon | | 2008/0153228 A1 | 6/2008 | Cheng |
| 2007/0147131 A1 | 6/2007 | Tran | | 2008/0153232 A1 | 6/2008 | Wong |
| 2007/0153577 A1 | 7/2007 | Guterman | | 2008/0153289 A1 | 6/2008 | Huang |
| 2007/0155087 A1 | 7/2007 | Chang | | 2008/0155186 A1 | 6/2008 | Ashokkumar |
| 2007/0158733 A1 | 7/2007 | Huang | | 2008/0158965 A1 | 7/2008 | Wang |
| 2007/0158734 A1 | 7/2007 | Chindalore | | 2008/0169498 A1 | 7/2008 | Dhaoui |
| 2007/0161191 A1 | 7/2007 | Yuan | | 2008/0175050 A1 | 7/2008 | Pesavento |
| 2007/0164346 A1 | 7/2007 | Yoshida | | 2008/0181013 A1 | 7/2008 | Chou |
| 2007/0166908 A1 | 7/2007 | Min | | 2008/0182375 A1 | 7/2008 | Rao |
| 2007/0166971 A1 | 7/2007 | Lojek | | 2008/0188052 A1 | 8/2008 | Winstead |
| 2007/0170495 A1* | 7/2007 | Mine et al. ............... 257/324 | | 2008/0203463 A1 | 8/2008 | Van Schaijk |
| 2007/0171756 A1 | 7/2007 | Lambrache | | 2008/0212373 A1 | 9/2008 | Hasegawa |
| 2007/0177427 A1 | 8/2007 | Park | | 2008/0216894 A1 | 9/2008 | Hammond |
| 2007/0183206 A1 | 8/2007 | Hisamoto | | 2008/0217675 A1 | 9/2008 | Liu |
| 2007/0183222 A1 | 8/2007 | Kanamori | | 2008/0227254 A1 | 9/2008 | Rao |
| 2007/0189033 A1 | 8/2007 | Watanabe | | 2008/0239795 A1 | 10/2008 | Ooishi |
| 2007/0189077 A1 | 8/2007 | Kanamori | | 2008/0242024 A1 | 10/2008 | Sugioka |
| 2007/0194366 A1 | 8/2007 | Kuo | | 2008/0242026 A1 | 10/2008 | Matsuzaki |
| 2007/0195607 A1 | 8/2007 | Eitan | | 2008/0242027 A1 | 10/2008 | Georgescu |
| 2007/0196982 A1 | 8/2007 | Eitan | | 2008/0253190 A1 | 10/2008 | Jeon |
| 2007/0200164 A1 | 8/2007 | Wu | | 2008/0261365 A1 | 10/2008 | Sasago |
| 2007/0205440 A1 | 9/2007 | Ishigaki | | 2008/0266944 A1 | 10/2008 | Chen |
| 2007/0212834 A1 | 9/2007 | Anderson | | 2008/0266959 A1 | 10/2008 | Haggag |
| 2007/0217267 A1 | 9/2007 | Wong | | 2008/0266977 A1 | 10/2008 | Wu |
| 2007/0217463 A1 | 9/2007 | Albrecht | | 2008/0266980 A1 | 10/2008 | Wu |
| 2007/0218632 A1 | 9/2007 | Chung | | 2008/0266981 A1 | 10/2008 | Koh |
| 2007/0221980 A1 | 9/2007 | Chang | | 2008/0273399 A1 | 11/2008 | Chen |
| 2007/0221982 A1 | 9/2007 | Ikeda | | 2008/0279557 A1 | 11/2008 | Park |
| 2007/0221983 A1 | 9/2007 | Lojek | | 2008/0283893 A1 | 11/2008 | Shih |
| 2007/0224736 A1 | 9/2007 | Kamigaichi | | 2008/0285348 A1 | 11/2008 | Kono |
| 2007/0232000 A1 | 10/2007 | Kuo | | 2008/0286982 A1 | 11/2008 | Li |
| 2007/0232041 A1 | 10/2007 | Choi | | 2008/0291728 A1 | 11/2008 | Terzioglu |
| 2007/0237005 A1 | 10/2007 | Widjaja | | 2008/0303067 A1 | 12/2008 | Rao |
| 2007/0238249 A1 | 10/2007 | Swift | | 2008/0303094 A1 | 12/2008 | Rao |
| 2007/0242523 A1 | 10/2007 | Liao | | 2008/0310233 A1 | 12/2008 | Aritome |
| 2007/0243681 A1 | 10/2007 | Kim | | 2008/0310464 A1 | 12/2008 | Schneider |
| 2007/0247915 A1 | 10/2007 | Kalnitsky | | 2008/0316772 A1 | 12/2008 | Terada |
| 2007/0247919 A1 | 10/2007 | Conte | | 2009/0000740 A1 | 1/2009 | Kojima |
| 2007/0252192 A1 | 11/2007 | Mokhlesi et al. | | 2009/0001450 A1 | 1/2009 | Kim |
| 2007/0254436 A1 | 11/2007 | Jung | | 2009/0003061 A1 | 1/2009 | Helm |
| 2007/0257304 A1 | 11/2007 | Terauchi | | 2009/0003081 A1 | 1/2009 | Hidaka |
| 2007/0262368 A1 | 11/2007 | Chang | | 2009/0008696 A1 | 1/2009 | Yang |
| 2007/0263448 A1 | 11/2007 | Wong | | 2009/0010072 A1 | 1/2009 | Tanaka |
| 2007/0267677 A1 | 11/2007 | Kuo | | 2009/0014171 A1 | 1/2009 | Woie |
| 2007/0267683 A1 | 11/2007 | Dietz | | 2009/0014771 A1 | 1/2009 | Ide |
| 2007/0273654 A1 | 11/2007 | Chen | | 2009/0014775 A1 | 1/2009 | Hisamoto |
| 2007/0278553 A1 | 12/2007 | Wu | | 2009/0014776 A1 | 1/2009 | Strenz |
| 2007/0285984 A1 | 12/2007 | Kato | | 2009/0016113 A1 | 1/2009 | Chen |
| 2007/0296034 A1 | 12/2007 | Chen | | 2009/0020244 A1 | 1/2009 | Stromberg |
| 2007/0297224 A1 | 12/2007 | King | | 2009/0026390 A1 | 1/2009 | Benveniste |
| 2008/0000459 A1 | 1/2008 | Okada | | 2009/0027972 A1 | 1/2009 | Bode |
| 2008/0008003 A1 | 1/2008 | Yoo | | 2009/0039410 A1 | 2/2009 | Liu |
| 2008/0029808 A1 | 2/2008 | Jeon | | 2009/0052245 A1 | 2/2009 | Li |
| 2008/0035981 A1 | 2/2008 | Chang | | 2009/0052259 A1 | 2/2009 | Arigane |
| 2008/0037326 A1 | 2/2008 | Kim | | 2009/0053866 A1 | 2/2009 | Hirooka |
| 2008/0042185 A1 | 2/2008 | Lojek | | 2009/0057793 A1 | 3/2009 | Koga |
| 2008/0042193 A1 | 2/2008 | Osabe | | 2009/0059664 A1 | 3/2009 | Lee |
| 2008/0049501 A1 | 2/2008 | Kim | | 2009/0059665 A1 | 3/2009 | Takikawa |
| 2008/0049506 A1 | 2/2008 | Guterman | | 2009/0059677 A1 | 3/2009 | Oka |
| 2008/0068887 A1 | 3/2008 | Chih | | 2009/0059678 A1 | 3/2009 | Strenz |
| 2008/0070363 A1 | 3/2008 | Mokhlesi | | 2009/0067239 A1 | 3/2009 | Tran |
| 2008/0073689 A1 | 3/2008 | Wang | | 2009/0073740 A1 | 3/2009 | Ogura |
| 2008/0073705 A1 | 3/2008 | Hisamoto | | 2009/0086540 A1 | 4/2009 | Hung |
| 2008/0079058 A1 | 4/2008 | Sakuma | | 2009/0086542 A1 | 4/2009 | Lee |
| 2008/0079059 A1 | 4/2008 | Wu | | 2009/0109720 A1 | 4/2009 | Lojek |
| 2008/0080244 A1 | 4/2008 | Lee | | 2009/0114971 A1 | 5/2009 | Cai |
| 2008/0083942 A1 | 4/2008 | Terzioglu et al. | | 2009/0122609 A1 | 5/2009 | Okazaki |
| 2008/0083947 A1 | 4/2008 | Sakuma | | 2009/0130814 A1 | 5/2009 | Liu |

| | | | |
|---|---|---|---|
| 2009/0135649 A1 | 5/2009 | Georgescu | |
| 2009/0140288 A1 | 6/2009 | Lee | |
| 2009/0141562 A1 | 6/2009 | Jeon | |
| 2009/0142910 A1 | 6/2009 | Hung | |
| 2009/0166708 A1 | 7/2009 | Io | |
| 2009/0173697 A1 | 7/2009 | Axtell | |
| 2009/0175304 A1 | 7/2009 | Noda | |
| 2009/0179249 A1 | 7/2009 | Tanaka | |
| 2009/0180320 A1 | 7/2009 | Torii | |
| 2009/0180321 A1 | 7/2009 | Torii | |
| 2009/0186459 A1 | 7/2009 | Chen | |
| 2009/0213649 A1 | 8/2009 | Takahashi | |
| 2010/0002524 A1 | 1/2010 | Sekiguchi | |
| 2010/0044775 A1 | 2/2010 | Sunamura | |
| 2010/0091572 A1 | 4/2010 | Choi | |
| 2010/0259981 A1 | 10/2010 | Ogura | |
| 2010/0264479 A1 | 10/2010 | Toba | |
| 2011/0012185 A1 | 1/2011 | Nishihara | |
| 2011/0021014 A1 | 1/2011 | Lee | |

FOREIGN PATENT DOCUMENTS

| | | |
|---|---|---|
| CN | 1855497 A | 11/2006 |
| EP | 0035160 A1 | 9/1981 |
| EP | 0265554 A1 | 5/1988 |
| EP | 0295935 A1 | 12/1988 |
| EP | 0317443 A1 | 5/1989 |
| EP | 0400483 A2 | 12/1990 |
| EP | 0440265 A2 | 8/1991 |
| EP | 0637035 A1 | 2/1995 |
| EP | 0 706 224 A2 | 4/1996 |
| EP | 0740306 A2 | 10/1996 |
| EP | 0788168 A1 | 8/1997 |
| EP | 0865045 A1 | 9/1998 |
| EP | 0875943 A2 | 11/1998 |
| EP | 0902438 A1 | 3/1999 |
| EP | 0996064 A1 | 4/2000 |
| EP | 1020925 A2 | 7/2000 |
| EP | 1022780 A2 | 7/2000 |
| EP | 1096572 A1 | 5/2001 |
| EP | 1148556 A2 | 10/2001 |
| EP | 1191541 A2 | 3/2002 |
| EP | 1244112 A2 | 9/2002 |
| EP | 1267410 A2 | 12/2002 |
| EP | 1313148 A2 | 5/2003 |
| EP | 1437771 A1 | 7/2004 |
| EP | 1437772 A1 | 7/2004 |
| EP | 1531493 A2 | 5/2005 |
| EP | 2053459 A1 | 4/2009 |
| JP | 51-147133 A | 12/1976 |
| JP | 52-033434 A | 3/1977 |
| JP | 52-046736 A | 4/1977 |
| JP | 52-063637 A | 5/1977 |
| JP | 53-039024 A | 4/1978 |
| JP | 53-108247 A | 9/1978 |
| JP | 53-110337 A | 9/1978 |
| JP | 54-016138 A | 2/1979 |
| JP | 54-066088 A | 5/1979 |
| JP | 54-110742 A | 8/1979 |
| JP | 55-046598 A | 4/1980 |
| JP | 55-074180 A | 6/1980 |
| JP | 55-089989 A | 7/1980 |
| JP | 56-001573 A | 1/1981 |
| JP | 56-021375 A | 2/1981 |
| JP | 56-033882 A | 4/1981 |
| JP | 56-094585 A | 7/1981 |
| JP | 56-118373 A | 9/1981 |
| JP | 58-097873 A | 6/1983 |
| JP | 60-009519 A | 1/1985 |
| JP | 61-099997 A | 5/1986 |
| JP | 63-052399 A | 3/1988 |
| JP | 63-156361 A | 6/1988 |
| JP | 63-306598 A | 12/1988 |
| JP | 02-110980 A | 4/1990 |
| JP | 02-114674 A | 4/1990 |
| JP | 02-149074 A | 6/1990 |
| JP | 02-285683 A | 11/1990 |
| JP | 02-295169 A | 12/1990 |
| JP | 03-048461 A | 3/1991 |
| JP | 04-291759 A | 10/1992 |
| JP | 05-096862 A | 4/1993 |
| JP | 05-191010 A | 7/1993 |
| JP | 06-021471 A | 1/1994 |
| JP | 06-120515 A | 4/1994 |
| JP | 06-140373 A | 5/1994 |
| JP | 06-223587 A | 8/1994 |
| JP | 06-252389 A | 9/1994 |
| JP | 06-309884 A | 11/1994 |
| JP | 07-094613 A | 4/1995 |
| JP | 07-191499 A | 7/1995 |
| JP | 07-193160 A | 7/1995 |
| JP | 07-276683 A | 10/1995 |
| JP | 08-148587 A | 6/1996 |
| JP | 09-011622 A | 1/1997 |
| JP | 10-056087 A | 2/1998 |
| JP | 10-275484 A | 10/1998 |
| JP | 11-031394 A | 2/1999 |
| JP | 2001-156189 A | 6/2001 |
| JP | 2001-217327 A | 8/2001 |
| JP | 2002-118184 A | 4/2002 |
| JP | 2003-046002 A | 2/2003 |
| JP | 2003-246491 A | 9/2003 |
| JP | 2003-255480 A | 9/2003 |
| JP | 2003-312064 A | 11/2003 |
| JP | 2004-170606 A | 6/2004 |
| JP | 2004-214506 A | 7/2004 |
| JP | 2004-281970 A | 10/2004 |
| JP | 2005-184028 A | 7/2005 |
| JP | 2005-184029 A | 7/2005 |
| JP | 2005-197624 A | 7/2005 |
| JP | 2005-217358 A | 8/2005 |
| JP | 2005-286185 A | 10/2005 |
| JP | 2006-190484 A | 7/2006 |
| JP | 2006-196650 A | 7/2006 |
| JP | 2006-253650 A | 9/2006 |
| JP | 2006-278848 A | 10/2006 |
| JP | 2007-003024 A | 1/2007 |
| JP | 2007-013207 A | 1/2007 |
| JP | 2007-032536 A | 2/2007 |
| JP | 2007-038684 A | 2/2007 |
| JP | 2007-045005 A | 2/2007 |
| JP | 2007-049919 A | 3/2007 |
| JP | 2007-072267 A | 3/2007 |
| JP | 2007-101371 A | 4/2007 |
| JP | 2007-128628 A | 5/2007 |
| JP | 2007-154829 A | 6/2007 |
| JP | 2007-180131 A | 7/2007 |
| JP | 2007-216100 A | 8/2007 |
| JP | 2007-224820 A | 9/2007 |
| JP | 2007-224930 A | 9/2007 |
| JP | 2007-230431 A | 9/2007 |
| JP | 2007-237605 A | 9/2007 |
| JP | 2007-245230 A | 9/2007 |
| JP | 2007-254022 A | 10/2007 |
| JP | 2007-257911 A | 10/2007 |
| JP | 2007-258568 A | 10/2007 |
| JP | 2007-261926 A | 10/2007 |
| JP | 2007-263443 A | 10/2007 |
| JP | 2007-269002 A | 10/2007 |
| JP | 2007-274008 A | 10/2007 |
| JP | 2007-330917 A | 12/2007 |
| JP | 2007-335718 A | 12/2007 |
| JP | 2008-003201 A | 1/2008 |
| JP | 2008-008163 A | 1/2008 |
| JP | 2008-012873 A | 1/2008 |
| JP | 2008-044109 A | 2/2008 |
| JP | 2008-060466 A | 3/2008 |
| JP | 2008-093331 A | 4/2008 |
| JP | 2008-103192 A | 5/2008 |
| JP | 2008-108869 A | 5/2008 |
| JP | 2008-111243 A | 5/2008 |
| JP | 2008-111244 A | 5/2008 |
| JP | 2008-118074 A | 5/2008 |
| JP | 2008-126539 A | 6/2008 |
| JP | 2008-138069 A | 6/2008 |
| JP | 2008-138921 A | 6/2008 |
| JP | 2008-138923 A | 6/2008 |
| JP | 2008-215697 A | 9/2008 |
| JP | 2008-231997 A | 10/2008 |

| | | |
|---|---|---|
| JP | 2008-235006 A | 10/2008 |
| JP | 2008-249236 A | 10/2008 |
| JP | 2008-262005 A | 10/2008 |
| JP | 2008-266944 A | 11/2008 |
| JP | 2008-267164 A | 11/2008 |
| JP | 2008-284796 A | 11/2008 |
| JP | 2008-286146 A | 11/2008 |
| JP | 2008-297590 A | 12/2008 |
| JP | 2009-012259 A | 1/2009 |
| JP | 2009-021041 A | 1/2009 |
| JP | 2009-021456 A | 1/2009 |
| JP | 2009-062904 A | 3/2009 |
| WO | WO 90/15412 A1 | 12/1990 |
| WO | WO 90/16085 A1 | 12/1990 |
| WO | WO 91/03054 A1 | 3/1991 |
| WO | 0457311 A2 | 11/1991 |
| WO | WO 92/16020 A1 | 9/1992 |
| WO | WO 95/19624 A1 | 7/1995 |
| WO | WO 95/30226 A1 | 11/1995 |
| WO | WO 96/30949 A1 | 10/1996 |
| WO | WO 97/21224 A2 | 6/1997 |
| WO | WO 97/32309 A1 | 9/1997 |
| WO | WO 98/29907 A2 | 7/1998 |
| WO | WO 98/34233 A1 | 8/1998 |
| WO | WO 98/44565 A1 | 10/1998 |
| WO | WO 99/19880 A1 | 4/1999 |
| WO | WO 00/51188 A1 | 8/2000 |
| WO | WO 00/58969 A1 | 10/2000 |
| WO | WO 00/75994 A1 | 12/2000 |
| WO | WO 01/17025 A2 | 3/2001 |
| WO | WO 03/003473 A1 | 1/2003 |
| WO | WO 03/021666 A1 | 3/2003 |
| WO | WO 2004/023543 A1 | 3/2004 |
| WO | WO 2004/064072 A2 | 7/2004 |
| WO | WO 2005/033949 A1 | 4/2005 |
| WO | WO 2006/085373 A1 | 8/2006 |
| WO | WO 2008/126177 A1 | 10/2008 |

OTHER PUBLICATIONS

Naruke, K., et al., "A New Flash-Erase EEPROM Cell with a Sidewall Select-Gate on Its Source Side," 1989 International Electron Devices Meeting, 1989 Technical Digest, Dec. 3-6, 1989, pp. 603-606, IEEE, Los Alamitos, CA.

Slotboom, M., et al., "Gate Isolation Technology for Compact Poly-CMP Embedded Flash Memories," 33rd Conference on European Solid-State Device Research, ESSDERC '03, Sep. 16-18, 2003, pp. 159-162, IEEE, Los Alamitos, CA.

"Technical Report H2-2003," Phillips Research Leuven, 2003, 4 pages, Heverlee, Belgium.

Akil, N., et al., "Optimization of Embedded Compact Nonvolatile Memories for Sub-100-nm CMOS Generations," IEEE Transactions on Electron Devices, Apr. 2005, vol. 52, No. 4, pp. 492-499, IEEE, Los Alamitos, CA.

Kamiya, M., et al., "EPROM Cell with High Gate Injection Efficiency," International Electron Devices Meeting, 1982, pp. 741-744, IEEE.

Mizutani, Y., et al., "A New EPROM Cell with a Side-Wall Floating Gate for High-Density and High-Performance Device," International Electron Devices Meeting, 1985, 5 pages, IEEE.

Chinese Office Action, Chinese Application No. 200810171402.2, Applicant: Infineon Technologies AG, Date of Issue: Dec. 21, 2010, 22 pages.

\* cited by examiner

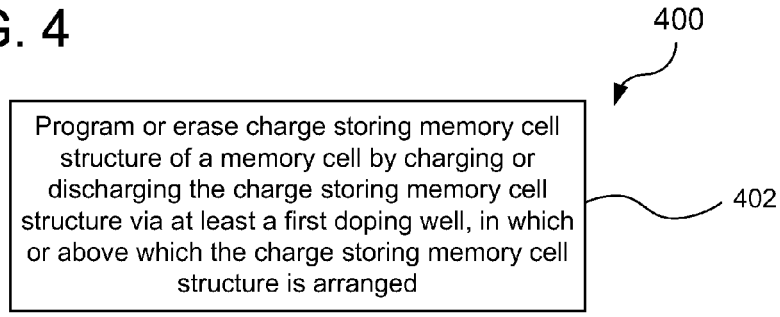
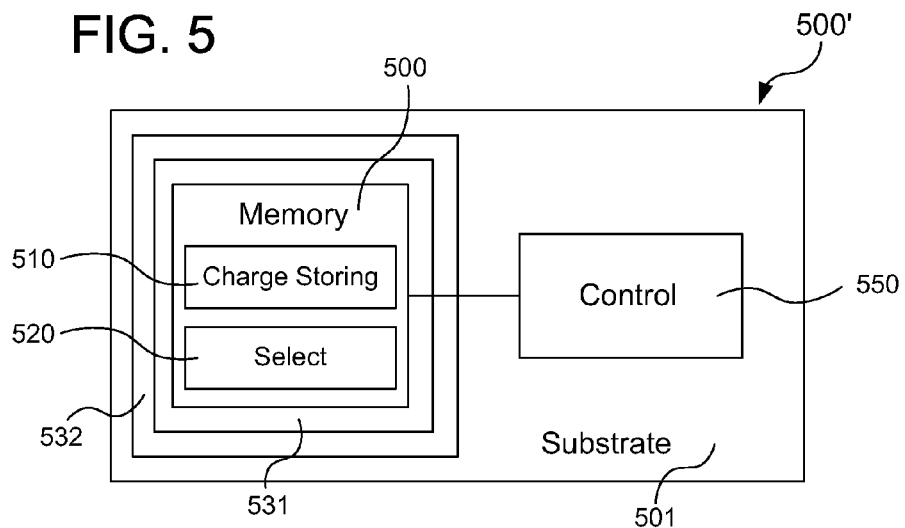
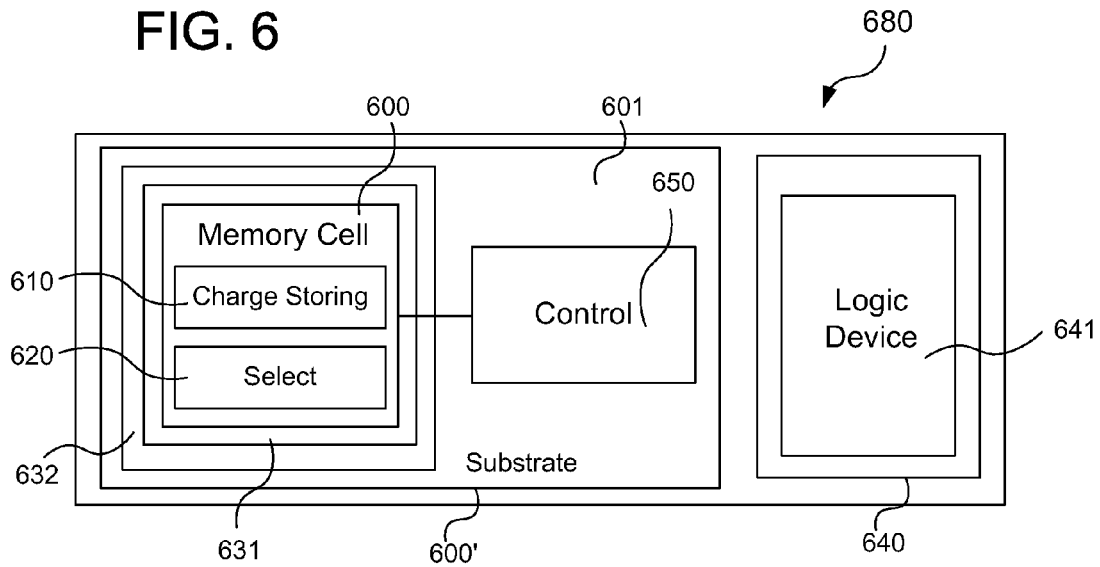

| | WL sel | SG sel | BL sel | CL sel | WL uns | SG uns | BL uns | CL uns | MW |
|---|---|---|---|---|---|---|---|---|---|
| Prog - SSI | 10 | 1.5 | 0 | 4-5 | 0 | 0 | 2-3 | 4-5 | 0 |

| | WL sel | SG sel | BL sel | CL sel | WL uns | SG uns | BL uns | CL uns | MW | |
|---|---|---|---|---|---|---|---|---|---|---|
| Erase FN GD | -11 | 0 | 6 | 6 | 1.5 | 1.5 | 6 | 6 | 6 | 851 |
| Erase FN HV | -11 | 0 | 6 | 6 | 6 | 6 | 6 | 6 | 6 | 852 |

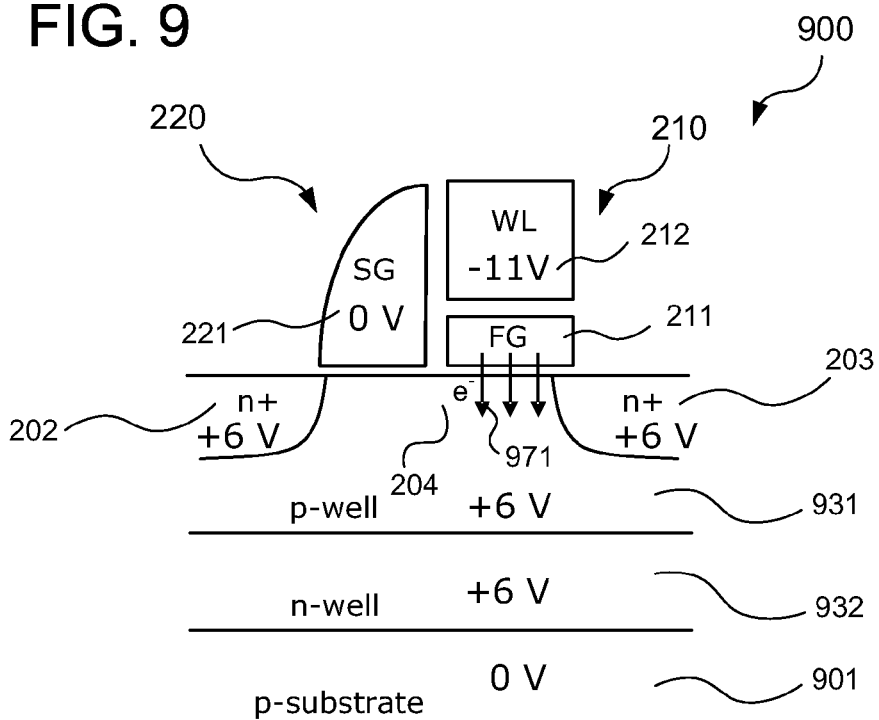
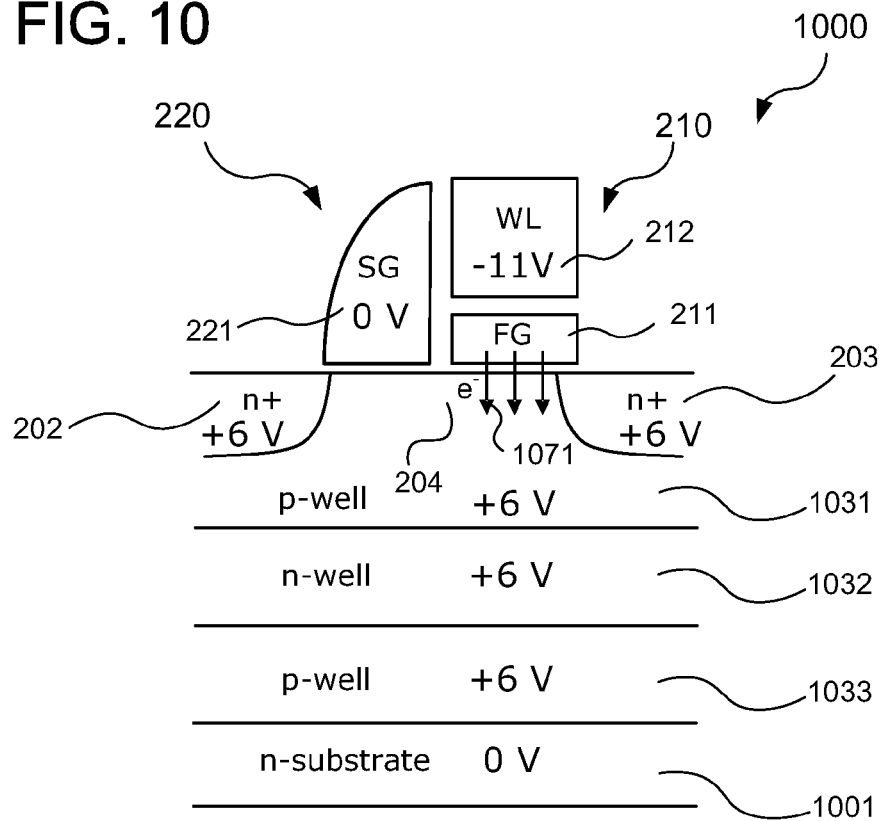

Program a selected memory cell of a plurality of memory cells of a memory array by applying a first voltage to a first source/drain region of the selected memory cell, applying a second voltage to a first source/drain region of at least one unselected memory cell of the plurality of memory cells, wherein the second voltage is different from the first voltage, and applying a third voltage to a second source/drain region of the selected memory cell and to the second source/drain region of the at least one unselected memory cell, wherein the second source/drain region of the selected memory cell and the second source/drain region of the at least one unselected memory cell are tied together

MEMORY CELL ARRANGEMENT, METHOD FOR CONTROLLING A MEMORY CELL, MEMORY ARRAY AND ELECTRONIC DEVICE

This application claims the benefit of U.S. Provisional Application No. 60/968,989, filed on Aug. 30, 2007, entitled SSI/HHE Flash Cell Optimized for Small Memory Sizes, and U.S. Provisional Application No. 60/975,884, filed on Sep. 28, 2007, entitled SSI/FN Triple Poly Flash Cell Optimized for Small Memory Sizes, which applications are hereby incorporated herein by reference.

TECHNICAL FIELD

Embodiments of the invention relate generally to memory cells, and in particular to a memory cell concept for small memory sizes.

BACKGROUND

One type of flash cell is the 1T-UCP Flash cell (1T=one transistor, UCP=uniform channel programming). This cell has a relatively large module area overhead independent of the memory size. Therefore, module areas are relatively large for small memory sizes. This may be relevant, for example, in certain markets where the main volume is achieved with products that have flash memory sizes in the range from about 100 kB to a few 100 kB. An additional boundary condition for these markets may be achieving a high write/erase endurance (write/erase cycle stability).

A conventional embedded flash (eFlash) cell concept optimized for low memory densities is the so-called SST ESF-1 cell shown in FIG. 15.

The flash cell 1500 shown in FIG. 15 includes a source 1502 and a drain 1503, which are formed in a substrate 1501. An insulating layer 1505 is formed on a channel region 1504 formed in the substrate 1501 between the source 1502 and the drain 1503, and on the source 1502. The flash cell 1500 is based on a split-gate concept, wherein a first polysilicon gate 1506 ("Poly 1") is formed within the insulating layer 1505, and a second polysilicon gate 1507 ("Poly 2") is formed on the insulating layer 1505 and partially overlaps the first polysilicon gate 1506 with the two gates 1506, 1507 being electrically insulated from one another by the insulating layer 1505.

The flash cell 1500 has the following properties: i) relatively low endurance (10 k-100 k cycles) due to the field enhanced poly/poly erase mechanism used; ii) the split-gate concept requires high overlay accuracy in lithography processes; iii) the scalability of the cell is relatively limited due to the large source underdiffusion needed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a method for controlling a memory cell in accordance with another embodiment;

FIG. 5 shows a memory cell arrangement in accordance with another embodiment;

FIG. 6 shows an electronic device in accordance with another embodiment;

FIG. 9 shows an erase mechanism used for erasing a memory cell in a memory cell arrangement in accordance with another embodiment;

FIG. 10 shows an erase mechanism used for erasing a memory cell in a memory cell arrangement in accordance with another embodiment;

FIG. 13 shows a method of operating a memory array in accordance with another embodiment;

DETAILED DESCRIPTION OF ILLUSTRATIVE EMBODIMENTS

Figure 1:
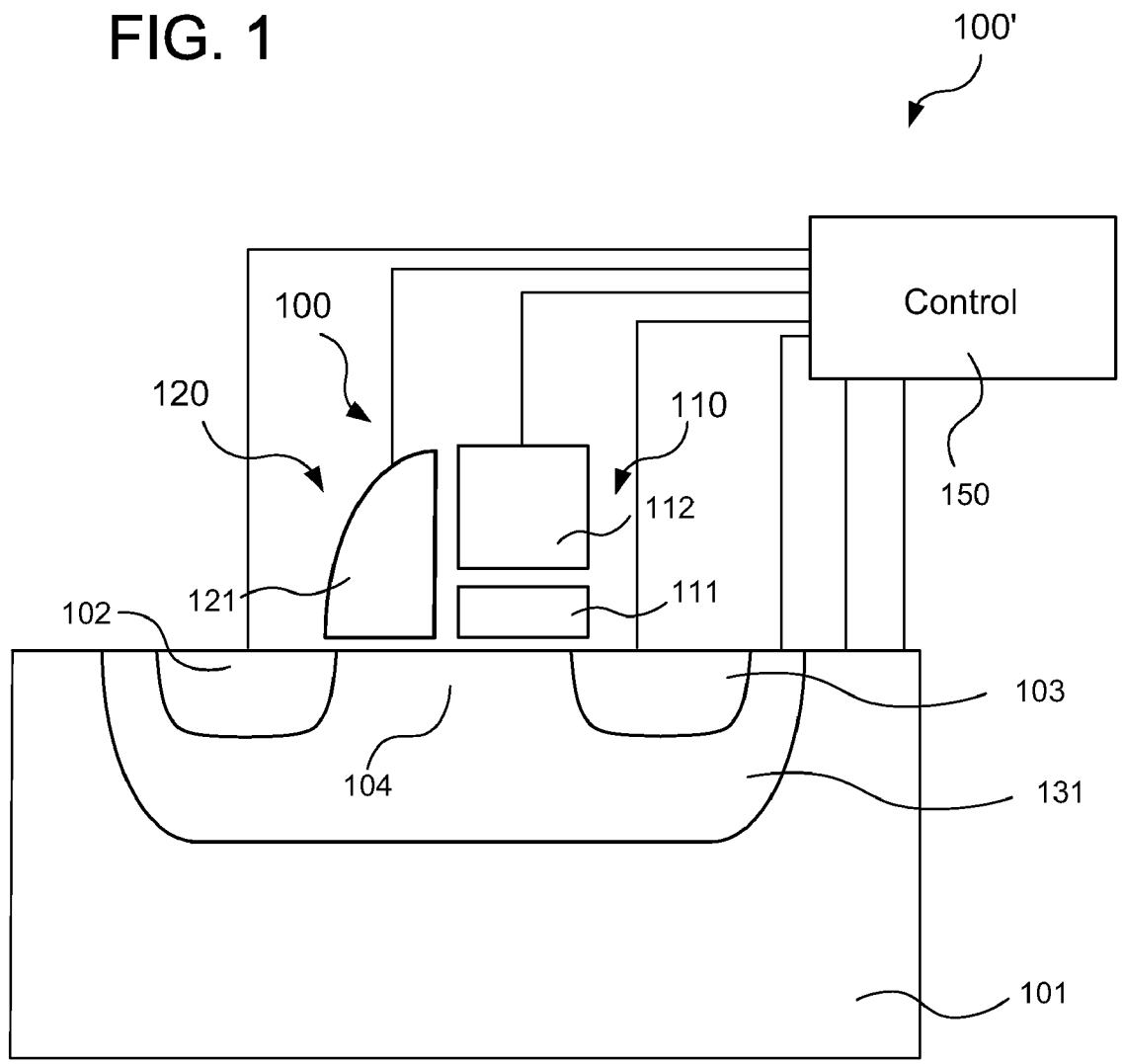
FIG. 1 shows a memory cell arrangement in accordance with an embodiment.

FIG. 1 shows a memory cell arrangement 100' in accordance with an embodiment.

The memory cell arrangement 100' includes a substrate 101 (for example, a semiconductor substrate, e.g., a silicon substrate). In accordance with an embodiment, a first doping well 131 may be arranged within the substrate 101, as shown. The memory cell arrangement 100' further includes at least one memory cell 100. The memory cell 100 includes a charge storing memory cell structure 110 and a select structure 120. In accordance with an embodiment, the select structure 120 may be formed as a spacer structure, as shown. The charge storing memory cell structure 110 may be arranged in or above the first doping well 131. In one or more embodiments the spacer structure may, for example, be formed by a deposition process (e.g., a conformal deposition process in accordance with one embodiment) of a material followed by an etch process (e.g., an anisotropic etch process in accordance with one embodiment) of the material.

Figure 2:
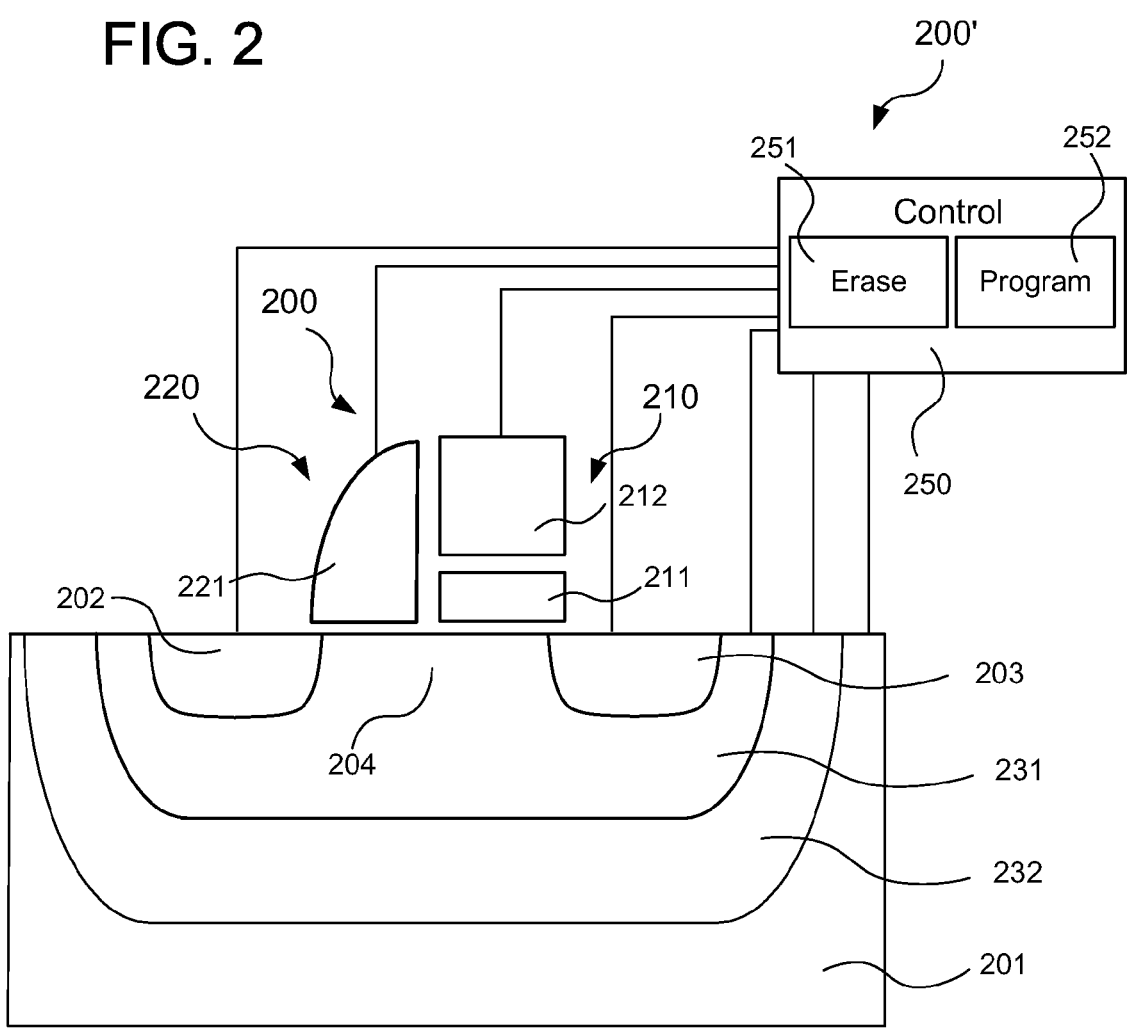
FIG. 2 shows a memory cell arrangement in accordance with another embodiment.

In accordance with another embodiment, the memory cell arrangement 100' may include at least one additional doping well arranged within the substrate 101, wherein the first doping well 131 may be arranged within the at least one additional doping well (not shown, see e.g., FIG. 2).

The memory cell arrangement 100' further includes a control circuit 150 that is coupled with the memory cell 100 and configured to control the memory cell 100 such that the charge storing memory cell structure 110 is programmed or erased by charging or discharging the charge storing memory cell structure 110 via at least the first doping well 131. In other words, charge carriers (e.g., electrons) may be introduced into the charge storing memory cell structure 110 via the first doping well 131, thereby programming the charge storing memory cell structure 110 (or the memory cell 100), and charge carriers (e.g., electrons) stored in the charge storing memory cell structure 110 may be drained via the first doping well 131, thereby erasing the charge storing memory cell structure 110 (or the memory cell 100).

In accordance with an embodiment, the control circuit 150 may include an erase circuit (not shown, see e.g., FIG. 2). The erase circuit may be configured to provide at least one electric potential to the memory cell 100 such that charge carriers (e.g., electrons) stored in the charge storing memory cell structure 110 are drained via at least the first doping well 131. In other words, the charge storing memory cell structure 110 may be erased by discharging the charge storing memory cell structure 110 via the first doping well 131 using the erase circuit.

In accordance with another embodiment, the control circuit 150 may include a program circuit (not shown, see e.g., FIG. 2). The program circuit may be configured to provide at least one electric potential to the memory cell 100 such that charge carriers (e.g., electrons) are introduced (e.g., injected) into the charge storing memory cell structure 110 via at least the first doping well 131. In other words, the charge storing memory cell structure 110 may be programmed by charging the charge storing memory cell structure 110 via the first doping well 131 using the program circuit.

In accordance with an embodiment, the at least one additional doping well may include a single doping well, which may be referred to as a second doping well (cf. FIG. 2). In accordance with other embodiments, the at least one additional doping well may include more than one doping well, for example, two, three or more doping wells in accordance with some embodiments, wherein the individual doping wells may be referred to as second, third, fourth, fifth, etc. doping wells (cf. FIG. 3 for a structure with two additional doping wells, i.e., a second doping well and a third doping well). In principle, the at least one additional doping well may include an arbitrary number of doping wells.

In accordance with an embodiment, the first doping well 131 may be doped with doping atoms of a first conductivity type.

In accordance with an embodiment, the memory cell 100 may include a first source/drain region 102 and a second source/drain region 103 formed in the first well region 131, and a channel region 104 formed between the first source/drain region 102 and the second source/drain region 103 in the first well region 131. The first source/drain region 102 may be proximate to the select structure 120 while the second source/drain region 103 may be distant from the select structure 120.

In accordance with an embodiment, the charge storing memory cell structure 110 and the select structure 120 may be formed next to one another and above the channel region 104, wherein the charge storing memory cell structure 110 and the select structure 120 may be electrically insulated from one another (for example, by means of one or more insulating or dielectric layers) and may be electrically insulated from the substrate 101 (for example, by means of one or more insulating or dielectric layers).

In accordance with an embodiment, the first source/drain region 102 and the second source/drain region 103 may be doped with doping atoms of a second conductivity type that is different from the first conductivity type.

In accordance with an embodiment, the first conductivity type may be a p-type conductivity type, and the second conductivity type may be an n-type conductivity type. In other words, in accordance with this embodiment, the first doping well 131 may be p-doped and the source/drain regions 102, 103 may be n-doped (e.g., n+ doped in one embodiment).

In accordance with one embodiment, the control circuit 150 (e.g., an erase circuit of the control circuit in accordance with an embodiment) may be configured to control the memory cell 100 such that the charge storing memory cell structure 110 is erased such that the charge carriers (e.g., electrons) stored in the charge storing memory cell structure 110 are drained via the first doping well 131 and/or via the at least one additional doping well and/or via the substrate 101.

In accordance with another embodiment, the control circuit (e.g., the erase circuit in accordance with an embodiment) may be configured to control the memory cell 100 such that the charge storing memory cell structure 110 is erased according to Fowler-Nordheim erase. In other words, the charge storing memory cell structure 110 may be erased by a Fowler-Nordheim (FN) tunneling erase mechanism, e.g., by FN electron tunneling. To put it in still other words, the control circuit 150 (e.g., the erase circuit) may be configured to control the memory cell 100 such that the charge storing memory cell structure 110 is erased according to Fowler-Nordheim erase via the first doping well 131.

In accordance with another embodiment, the charge storing memory cell structure 110 may be a non-volatile charge storing memory cell structure.

In accordance with one embodiment, the charge storing memory cell structure 110 may be a floating gate memory cell structure. In this case, the charge storing memory cell structure 110 may include a layer stack including a first layer 111, which may be configured as a floating gate (e.g., as a polysilicon floating gate) and arranged at least partially above the channel region 104, and a second layer 112, which may be configured as a control gate and may be arranged at least partially above the floating gate. Alternatively, the second layer 112 may be configured as a wordline (WL). The second layer (e.g., the control gate) may be electrically insulated from the first layer 111 (e.g., the floating gate) by means of one or more insulating or dielectric layers.

In accordance with another embodiment, the charge storing memory cell structure 110 may be a charge trapping memory cell structure. In this case, the charge storing memory cell stucture 110 may include a layer stack including a first layer 111, which may be configured as a charge trapping layer (e.g., as an oxide-nitride-oxide (ONO) layer stack) and arranged at least partially above the channel region 104, and a second layer 112, which may be configured as a control gate and may be arranged at least partially above the charge trapping layer. Alternatively, the second layer 112 may be configured as a wordline (WL).

In accordance with one embodiment, the memory cell 100 may be configured as a flash memory cell, e.g., as an embedded flash memory cell.

In accordance with another embodiment, the control circuit 150 (e.g., a program circuit of the control circuit, in accordance with an embodiment) may be configured to control the memory cell 100 such that the charge storing memory cell structure 110 is programmed using a source side injection (SSI) mechanism.

In accordance with another embodiment, the memory cell arrangement 100' may further include a first wordline structure that may be coupled with the memory cell 100 and the control circuit 150, and a second wordline structure that may be coupled with another memory cell including another charge storing memory cell structure. The control circuit 150 (e.g., an erase circuit of the control circuit in accordance with an embodiment) may be configured to provide a wordline inhibit voltage to the second wordline and thereby to the other charge storing memory cell structure when erasing the charge storing memory cell structure 110 of the memory cell 100.

In accordance with another embodiment, the wordline inhibit voltage may be substantially equal to a voltage provided to the substrate 101 and/or to the first doping well 131 and/or to the at least one additional doping well.

In accordance with another embodiment, the wordline inhibit voltage may be lower than a voltage provided to the substrate 101 and/or to the first doping well 131 and/or to the at least one additional doping well.

In accordance with one embodiment, the select structure 120 may include a select gate 121 that may be configured as a spacer and laterally disposed from a sidewall of the charge storing memory cell structure 110, as shown. In other words, the select gate 121 may be formed as a sidewall spacer over a sidewall of the charge storing memory cell structure 110. The select gate 121 may also be referred to as a spacer select gate.

FIG. 2 shows a memory cell arrangement 200' in accordance with another embodiment.

The memory cell arrangement 200' includes a substrate 201 (for example, a semiconductor substrate, e.g., a silicon substrate), a first doping well 231 and a second doping well 232, wherein the first doping well 231 is arranged within the second doping well 232 and the second doping well 232 is arranged within the substrate 201. The memory cell arrangement 200' further includes at least one memory cell 200. The memory cell 200 includes a charge storing memory cell structure 210 and a select structure 220. In accordance with an embodiment, the select structure 220 may be formed as a spacer structure, as shown. The charge storing memory cell structure 210 is arranged in or above the first doping well 231. The memory cell arrangement 200' further includes a control circuit 250 that is coupled with the memory cell 200 and configured to control the memory cell 200 such that the charge storing memory cell structure 210 is programmed or erased by charging or discharging the charge storing memory cell structure 210 via at least the first doping well 231. In other words, charge carriers (e.g., electrons) may be introduced into the charge storing memory cell structure 210 via the first doping well 231, thereby programming the charge storing memory cell structure 210 (or the memory cell 200), and charge carriers (e.g., electrons) stored in the charge storing memory cell structure 210 may be drained via the first doping well 231, thereby erasing the charge storing memory cell structure 210 (or the memory cell 200).

In accordance with an embodiment, the control circuit 250 may include an erase circuit 251, as shown. The erase circuit 251 may be configured to provide at least one electric potential to the memory cell 200 such that charge carriers (e.g., electrons) stored in the charge storing memory cell structure 210 are drained via at least the first doping well 231. In other words, the charge storing memory cell structure 210 may be erased by discharging the charge storing memory cell structure 210 via the first doping well 231 using the erase circuit 251.

In accordance with another embodiment, the control circuit 250 may include a program circuit 252, as shown. The program circuit 252 may be configured to provide at least one electric potential to the memory cell 200 such charge carriers (e.g., electrons) are introduced (e.g., injected) into the charge storing memory cell structure 210 via at least the first doping well 231. In other words, the charge storing memory cell structure 210 may be programmed by charging the charge storing memory cell structure 210 via the first doping well 231 using the program circuit 252.

Clearly, the memory cell arrangement 200' in accordance with the embodiment shown in FIG. 2 has a triple-well structure including a first doping well 231 and a second doping well 232, wherein the first doping well 231 is arranged within the second doping well 232 and the second doping well 232 is arranged within the substrate 201.

In accordance with an embodiment, the first doping well 231 may be doped with doping atoms of a first conductivity type.

In accordance with another embodiment, the second doping well 232 may be doped with doping atoms of a second conductivity type which is different from the first conductivity type.

In accordance with another embodiment, the substrate 201 may be doped with doping atoms of the first conductivity type.

As shown in FIG. 2, in accordance with some embodiments, the memory cell 200 may include a first source/drain region 202 and a second source/drain region 203 formed in the first well region 231, and a channel region 204 formed between the first source/drain region 202 and the second source/drain region 203 in the first well region 231.

In accordance with some embodiments, the charge storing memory cell structure 210 and the select structure 220 may be formed next to one another and above the channel region 204, wherein the charge storing memory cell structure 210 and the select structure 220 are electrically insulated from one another (for example, by means of one or more insulating layers) and are electrically insulated from the channel region 204 (for example, by means of one or more insulating layers).

In accordance with one embodiment, the first and second source/drain regions 202, 203 may be doped with doping atoms of the second conductivity type.

In accordance with one embodiment, the first conductivity type may be a p-type conductivity type, and the second conductivity type may be an n-type conductivity type. In other words, in accordance with this embodiment, the first doping well 231 may be p-doped and the second doping well 232 may be n–doped. In this case, the substrate 201 may also be p-doped, and the memory cell 200 may include n–doped (e.g., n+ doped in one embodiment) source/drain regions 202, 203.

In accordance with another embodiment, the erase circuit 251 may be configured to provide the same electric potential to the first doping well 231 and to the second doping well 232.

In accordance with one embodiment, the erase circuit 251 may be configured to control the memory cell 200 such that the charge storing memory cell structure 210 is erased such that the charge carriers are drained via the first doping well 231 and/or via the second doping well 232 and/or via the substrate 201.

In accordance with another embodiment, the erase circuit 251 may be configured to control the memory cell 200 such that the charge storing memory cell structure 210 is erased according to Fowler-Nordheim erase. In other words, the charge storing memory cell structure 210 may be erased by a Fowler-Nordheim (FN) tunneling erase mechanism, e.g. by FN electron tunneling. To put it in still other words, the erase circuit 251 may be configured to control the memory cell 200 such that the charge storing memory cell structure 210 is erased according to Fowler-Nordheim erase via at least the first doping well 231.

In accordance with another embodiment, the charge storing memory cell structure 210 may be a non-volatile charge storing memory cell structure.

In accordance with one embodiment, the charge storing memory cell structure 210 may be a floating gate memory cell structure. In this case, the charge storing memory cell structure 210 may include a layer stack including a first layer 211, which may be configured as a floating gate (e.g., as a polysilicon floating gate) and arranged at least partially above the channel region 204, and a second layer 212, which may be configured as a control gate and may be arranged at least partially above the floating gate. Alternatively, the second layer 212 may be configured as a wordline (WL).

In accordance with another embodiment, the charge storing memory cell structure 210 may be a charge trapping memory cell structure. In this case, the charge storing memory cell stucture 210 may include a layer stack including a first layer 211, which may be configured as a charge trapping layer (e.g., as an oxide-nitride-oxide (ONO) layer stack) and arranged at least partially above the channel region 204, and a second layer 212, which may be configured as a control gate and may be arranged at least partially above the charge trapping layer. Alternatively, the second layer 212 may be configured as a wordline (WL).

In accordance with one embodiment, the memory cell 200 may be configured as a flash memory cell, e.g., as an embedded flash memory cell.

In accordance with another embodiment, the program circuit 252 may be configured to control the memory cell 200 such that the charge storing memory cell structure 210 is programmed using a source side injection (SSI) mechanism.

In accordance with another embodiment, the memory cell arrangement 200' may further include a first wordline structure that may be coupled with the memory cell 200 and the control circuit 250 (e.g., with the erase circuit 251 in accordance with an embodiment) and a second wordline structure that may be coupled with another memory cell including another charge storing memory cell structure. The control circuit 250 (e.g., the erase circuit 251 in accordance with an embodiment) may be configured to provide a wordline inhibit voltage to the second wordline and thereby to the other charge storing memory cell structure when erasing the charge storing memory cell structure 210 of the memory cell 200.

In accordance with another embodiment, the wordline inhibit voltage may be substantially equal to a voltage provided to the first doping well 231 and/or to the second doping well 232 and/or to the substrate 201.

In accordance with another embodiment, the wordline inhibit voltage may be lower than a voltage provided to the first doping well 231 and/or to the second doping well 232 and/or to the substrate 201.

In accordance with one embodiment, the select structure 220 may include a select gate 221 configured as a spacer and laterally disposed from a sidewall of the charge storing memory cell structure 210, as shown in FIG. 2. In other words, the select gate 221 may be formed as a sidewall spacer over a sidewall of the charge storing memory cell structure 210. The select gate 221 may also be referred to as a spacer select gate. In accordance with one embodiment, the source/drain region located proximate to the select structure 220 (the first source/drain region 202 in accordance with the embodiment shown in FIG. 2) may be coupled to a common bitline. In other words, the spacer select gate 221 may be formed at a sidewall of the charge storing memory cell structure 210 that faces a source/drain region (of the memory cell 200) that is connected to a common bitline. The common bitline may be coupled to a plurality of source/drain regions (of a plurality of memory cells), each of the source/drain regions being in each case located proximate to a select structure of a respective memory cell.

Figure 3:
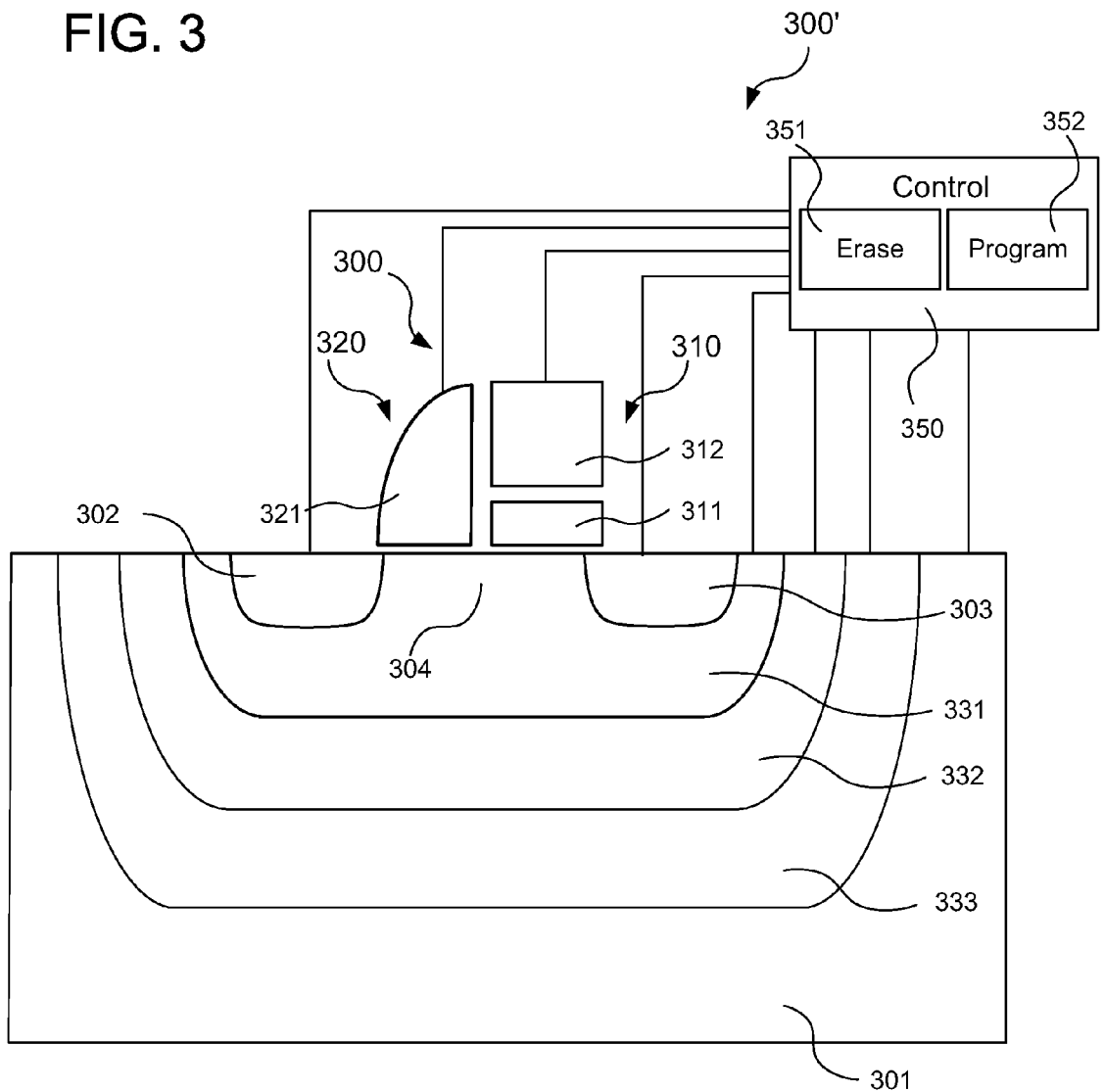
FIG. 3 shows a memory cell arrangement in accordance with another embodiment.

FIG. 3 shows a memory cell arrangement 300' in accordance with another embodiment.

The memory cell arrangement 300' includes a substrate 301, a first doping well 331, a second doping well 332 and a third doping well 333, wherein the first doping well 331 is arranged within the second doping well 332, wherein the second doping well 332 is arranged within the third doping well 333, and wherein the third doping well 333 is arranged within the substrate 301. Clearly, the memory cell arrangement 300' has a quadruple-well structure (or quattro-well structure) including first, second and third doping wells 331, 332, 333, wherein the first doping well 331 is arranged within the second doping well 332, the second doping well 332 is arranged within the third doping well 333 and the third doping well 333 is arranged within the substrate 301.

In accordance with an embodiment, the first doping well 331 may be doped with doping atoms of a first conductivity type and the second doping well 332 may be doped with doping atoms of a second conductivity type which is different from the first conductivity type.

In accordance with one embodiment, the third doping well 333 may be doped with doping atoms of the first conductivity type.

In accordance with one embodiment, the substrate 301 may be doped with doping atoms of the second conductivity type, that is, of the same conductivity type as the doping atoms of the second doping well 332. The memory cell arrangement 300' further includes at least one memory cell 300 including a charge storing memory cell structure 310 and a select structure 320. The memory cell arrangement 300' further includes a control circuit 350 coupled with the memory cell 300 and configured to control the memory cell 300 such that the charge storing memory cell structure 310 is programmed or erased by charging or discharging the charge storing memory cell structure 310 via at least the first doping well 331.

In accordance with one embodiment, the control circuit 350 may include an erase circuit 351 (as shown in FIG. 3) that may be configured to provide at least one electric potential to the memory cell 300 such that charge carriers (e.g., electrons) stored in the charge storing memory cell structure 310 are drained via at least the first doping well 331. In accordance with some embodiments, the stored charge carriers may be drained via the doping wells 331, 332, 333 and the substrate 301. In accordance with one embodiment, the memory cell 300 may be erased using a Fowler-Nordheim well erase mechanism.

In accordance with another embodiment, the control circuit 350 may include a program circuit 352 (as shown in FIG. 3) that may be configured to provide at least one electric potential to the memory cell 300 such that charge carriers (e.g., electrons) are introduced (e.g., injected) into the charge storing memory cell structure 310 via at least the first doping well 331. In accordance with one embodiment, the charge carriers may be introduced into the charge storing memory cell structure 310 using a source side injection (SSI) mechanism.

In accordance with one embodiment, the first conductivity type may be a p-type conductivity type, and the second conductivity type may be an n-type conductivity type. In other words, in accordance with this embodiment, the first doping well 331 may be p-doped and the second doping well 332 may be n-doped. The third doping well 333 may also be p-doped, and the substrate 301 may be n-doped. The memory cell 300 may further include first and second source/drain regions 302, 303 and a channel region 304 formed in the first doping well 331, as shown.

In accordance with some embodiments, the charge storing memory cell structure 310 and the select structure 320 may be formed next to one another and above the channel region 304, wherein the charge storing memory cell structure 310 and the select structure 320 may be electrically insulated from one another (for example, by means of one or more insulating layers) and may be electrically insulated from the channel region 304 (for example, by means of one or more insulating layers).

In accordance with one embodiment, the first source/drain region 302 and the second source/drain region 303 may be doped with doping atoms of the second conductivity type, for example n-doped (e.g., n+ doped in one embodiment).

In accordance with another embodiment, the erase circuit 351 may be configured to provide the same electric potential to the first doping well 331, to the second doping well 332 and to the third doping well 333.

In accordance with one embodiment, the erase circuit 351 may be configured to control the memory cell 300 such that the charge storing memory cell structure 310 is erased such that the charge carriers are drained via the first doping well 331 and/or via the second doping well 332 and/or via the third doping well 333 and/or via the substrate 301.

In accordance with another embodiment, the erase circuit 351 may be configured to control the memory cell 300 such that the charge storing memory cell structure 310 is erased according to Fowler-Nordheim erase. In other words, the charge storing memory cell structure 310 may be erased by a Fowler-Nordheim (FN) tunneling erase mechanism, e.g., by FN electron tunneling. To put it in still other words, the erase circuit 351 may be configured to control the memory cell 300 such that the charge storing memory cell structure 310 may be erased according to Fowler-Nordheim erase via at least the first doping well 331.

In accordance with another embodiment, the charge storing memory cell structure 310 may be a non-volatile charge storing memory cell structure.

In accordance with one embodiment, the charge storing memory cell structure 310 may be a floating gate memory cell structure. In this case, the charge storing memory cell structure 310 may include a layer stack including a first layer 311, which may be configured as a floating gate (e.g., as a polysilicon floating gate) and arranged at least partially above the channel region 304, and a second layer 312, which may be configured as a control gate and may be arranged at least partially above the floating gate. Alternatively, the second layer 312 may be configured as a wordline (WL).

In accordance with another embodiment, the charge storing memory cell structure 310 may be a charge trapping memory cell structure. In this case, the charge storing memory cell stucture 310 may include a layer stack including a first layer 311, which may be configured as a charge trapping layer (e.g., as an oxide-nitride-oxide (ONO) layer stack) and arranged at least partially above the channel region 304, and a second layer 312, which may be configured as a control gate and may be arranged at least partially above the charge trapping layer. Alternatively, the second layer 312 may be configured as a wordline (WL).

In accordance with one embodiment, the memory cell 300 may be configured as a flash memory cell, e.g., as an embedded flash memory cell.

In accordance with another embodiment, the program circuit 352 may be configured to control the memory cell 300 such that the charge storing memory cell structure 310 may be programmed using a source side injection (SSI) mechanism.

In accordance with another embodiment, the memory cell arrangement 300' may further include a first wordline structure that may be coupled with the memory cell 300 and the control circuit 350 (e.g., with the erase circuit 351 in accordance with an embodiment), and a second wordline structure that may be coupled with another memory cell including another charge storing memory cell structure. The control circuit 350 (e.g., the erase circuit 351 in accordance with an embodiment) may be configured to provide a wordline inhibit voltage to the second wordline and thereby to the other charge storing memory cell structure when erasing the charge storing memory cell structure 310 of the memory cell 300.

In accordance with another embodiment, the wordline inhibit voltage may be substantially equal to a voltage provided to the first doping well 331 and/or to the second doping well 332 and/or to the third doping well 333 and/or to the substrate 301.

In accordance with another embodiment, the wordline inhibit voltage may be lower than a voltage provided to the first doping well 331 and/or to the second doping well 332 and/or to the third doping well 333 and/or to the substrate 301.

In accordance with one embodiment, the select structure 320 may include a select gate 321 configured as a spacer and laterally disposed from a sidewall of the charge storing memory cell structure 310, as shown in FIG. 3. In other words, the select gate 321 may be formed as a sidewall spacer over a sidewall of the charge storing memory cell structure 310. The select gate 321 may also be referred to as a spacer select gate. In accordance with one embodiment, the source/drain region located proximate to the select structure 320 (the first source/drain region 302 in accordance with the embodiment shown in FIG. 3) may be coupled to a common bitline. In other words, the spacer select gate 321 may be formed at a sidewall of the charge storing memory cell structure 310 that faces a source/drain region (of the memory cell 300) that is connected to a common bitline. The common bitline may be coupled to a plurality of source/drain regions (of a plurality of memory cells), each of the source/drain regions being in each case located proximate to a select structure of a respective memory cell.

FIG. 4 shows a method 400 for controlling a memory cell in accordance with another embodiment. The at least one memory cell includes a charge storing memory cell structure and a select structure. In accordance with an embodiment, the select structure may be formed as a spacer structure that may include a select gate configured as a spacer and laterally disposed from at a sidewall of the charge storing memory cell structure. The charge storing memory cell structure is arranged in or above a first doping well which is arranged within at least one additional doping well. In accordance with an embodiment, the at least one additonal doping well includes a second doping well and a third doping well, wherein the first doping well is arranged within the second doping well and the second doping well is arranged within the third doping well.

In 402, the charge storing memory cell structure is programmed or erased by charging or discharging the charge storing memory cell structure via at least the first doping well.

In accordance with one embodiment, the charge storing memory cell structure may be erased such that charge carriers (e.g., electrons) stored in the charge storing memory cell structure are drained via at least the first doping well. In accordance with another embodiment, the memory cell may be programmed such that charge carriers (e.g., electrons) are introduced into the charge storing memory cell structure via at least the first doping well. In accordance with one embodiment, the memory cell may be erased by means of Fowler-Nordheim tunneling of charge carriers from the charge storing memory cell structure into the first doping well. In accordance with another embodiment, the memory cell may be programmed by means of source side injection of charge carriers from the first doping well into the charge storing memory cell structure.

FIG. 5 shows a memory cell arrangement 500' in accordance with another embodiment.

The memory cell arrangement 500' includes a substrate 501 and at least one memory means 500. The memory means 500 includes a charge storing memory means 510 and a select means 520. The memory cell arrangement 500' further includes a first doping well 531 arranged within the substrate 501, wherein the charge storing memory means 510 is arranged in or above the first doping well 531. Furthermore, the memory cell arrangement 500' includes at least one additional doping well 532 arranged within the substrate 501, wherein the first doping well 531 is arranged within the at least one additional doping well 532. In accordance with an embodiment, the at least one additional doping well 532 includes a second doping well and a third doping well, wherein the first doping well 531 is arranged within the second doping well and the second doping well is arranged within the third doping well.

The memory cell arrangement 500' further includes a control means 550 coupled with the memory means 500 and configured to control the memory means 500 such that the charge storing memory means 510 is programmed or erased by charging or discharging the charge storing memory means 510 via at least the first doping well 531. In accordance with an embodiment, the control means 550 may include an erase means that is configured to provide at least one electric potential to the memory means 500 such that charge carriers (e.g., electrons) stored in the charge storing memory means 510 are drained via at least the first doping well 531. In accordance with another embodiment, the control means 550 may include a program means that is configured to provide at least one electric potential to the memory means 550 such that charge carriers (e.g., electrons) are introduced (e.g., injected) into the charge storing memory means 510 via at least the first doping well 531.

FIG. 6 shows an electronic device 680 in accordance with another embodiment.

The electronic device 680 includes a logic arrangement 640 including at least one logic device 641. Furthermore, the electronic device 680 includes a memory cell arrangement 600'. The memory cell arrangement 600' includes a substrate 601 and at least one memory cell 600. The memory cell 600 includes a charge storing memory cell structure 610 and a select structure 620. In accordance with an embodiment, the select structure 620 may be formed as a spacer structure. The memory cell arrangement 600' further includes a first doping well 631 arranged within the substrate 601, wherein the charge storing memory cell structure 610 is arranged in or above the first doping well 631. Furthermore, the memory cell arrangement 600' includes at least one additional doping well 632 arranged within the substrate 601, wherein the first doping well 631 is arranged within the at least one additional doping well 632. In accordance with an embodiment, the at least one additional doping well 632 includes a second doping well and a third doping well, wherein the first doping well 631 is arranged within the second doping well and the second doping well is arranged within the third doping well.

The memory cell arrangement 600' further includes a control circuit 650 coupled with the memory cell 600 and configured to control the memory cell 600 such that the charge storing memory cell structure 610 is programmed or erased by charging or discharging the charge storing memory cell structure 610 via at least the first doping well 631.

In accordance with one embodiment, the logic arrangement 640 may include at least one programmable logic device.

In accordance with an embodiment, the control circuit 650 may include an erase circuit that may be configured to provide at least one electric potential to the memory cell 600 such that charge carriers (e.g., electrons) stored in the charge storing memory cell structure 610 are drained via at least the first doping well 631.

In accordance with another embodiment, the erase circuit may be configured to control the memory cell 600 such that the charge storing memory cell structure 610 may be erased according to Fowler-Nordheim erase via at least the first doping well 631.

In accordance with another embodiment, the control circuit 650 may include a program circuit that may be configured to provide at least one electric potential to the memory cell 600 such that charge carriers are introduced into the charge storing memory cell structure 610 via at least the first doping well 631. In accordance with one embodiment, the program circuit may be configured to control the memory cell 600 such that the charge storing memory cell structure 610 is programmed using a source side injection (SSI) mechanism.

In accordance with one embodiment, the spacer structure may include a select gate that may be configured as a spacer and may be laterally disposed from a sidewall of the charge storing memory cell structure 610.

In accordance with another embodiment, the charge storing memory cell structure 610 may be a floating gate memory cell structure. In accordance with another embodiment, the charge storing memory cell structure 610 may be a charge trapping memory cell structure.

In accordance with another embodiment, the memory cell arrangement 600' may have a triple-well structure similar to the one shown in FIG. 2. In accordance with another embodiment, the memory cell arrangement 600' may have a quadruple-well structure similar to the one shown in FIG. 3. Alternatively, the memory cell arrangement 600' may have a different structure, e.g., a different number of doping wells.

In accordance with one embodiment, the electronic device 680 may be configured as a smart card device.

Figures 7, 8A, 8B:
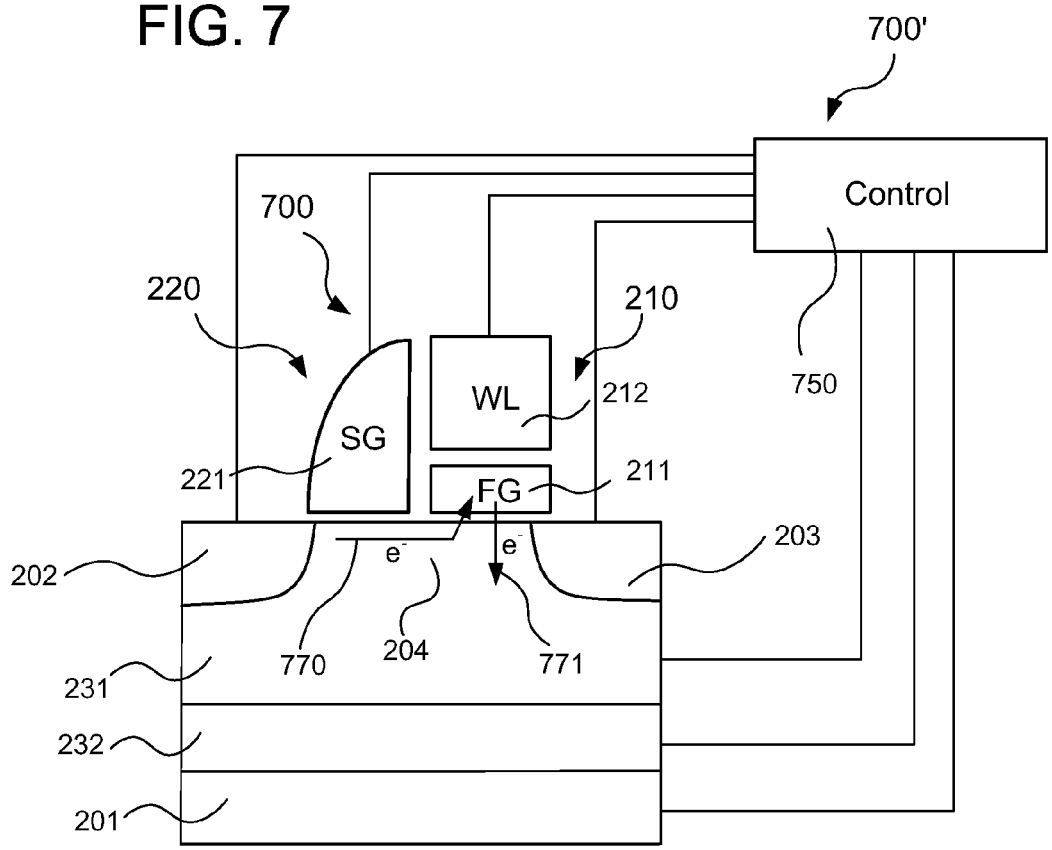
FIG. 7 shows program and erase mechanisms used for programming/erasing a memory cell in a memory cell arrangement in accordance with another embodiment.
FIG. 8A shows a table illustrating biasing voltages used for programming a memory cell in a memory cell arrangement in accordance with another embodiment.
FIG. 8B shows a table illustrating biasing voltages used for erasing a memory cell in a memory cell arrangement in accordance with another embodiment.

FIG. 7 illustrates program and erase mechanisms used for programming/erasing a memory cell 700 in a memory cell arrangement 700' in accordance with an embodiment.

The memory cell 700 of the memory cell arrangement 700' is configured in a similar manner as the memory cell 200 of the memory cell arrangement 200 described in connection with FIG. 2. Here, the charge storing memory cell structure 210 is configured as a floating gate memory cell structure having a stacked structure including a floating gate (FG) 211 and a wordline (WL) 212 arranged above the floating gate 211 and electrically insulated from the floating gate 211. In an alternative embodiment, the charge storing memory cell structure 210 may be configured as a charge trapping memory cell structure as described herein above.

The select structure 220 includes a select gate (SG) 221, which is configured as a spacer (e.g., as a polysilicon spacer) located at the sidewall of the charge storing memory cell structure 210 (for example, at the sidewalls of the floating gate 211 and of the wordline 212).

Apart from the memory cell 700 shown in FIG. 7, the memory cell arrangement 700' may include additional memory cells (not shown in FIG. 7), for example, a plurality or a multiplicity of memory cells which may be configured in a similar manner as the memory cell 700. In accordance with one embodiment, the memory cells may be arranged in a regular array structure in rows and columns (see e.g., FIG. 12A or FIG. 12B).

The memory cell arrangement 700' includes a control circuit 750. In accordance with some embodiments, the control circuit 750 may include an erase circuit and/or a program circuit as described herein above. The control circuit 750 of the memory cell arrangement 700' is connected to the wordline 212, to the select gate 221, to the first source/drain region 202, and to the second source/drain region 203 of the memory cell 700 (and possibly to other memory cells of the memory cell arrangement 700' not shown in FIG. 7). Furthermore, the control circuit 750 is connected to the first doping well 231, to the second doping well 232, and to the substrate 201.

In accordance with one embodiment, programming of the cell 700 may be achieved by source side injection (SSI) of charge carriers (e.g., electrons) from the substrate 201 (e.g., from a channel region 204 formed within the first doping well 231) into the floating gate 211 as is illustrated by the arrow 770 in FIG. 7. The source side injection program mechanism may be achieved by applying appropriate electrical voltages to the first source/drain region 202, the second source/drain region 203, the select gate 221, and the wordline 212, for example, by means of a program circuit (not shown in FIG. 7) coupled to the memory cell 700 (and possibly to other memory cells of the memory cell arrangement 700' not shown in FIG. 7).

In accordance with one embodiment, programming of the memory cell 700 may be achieved by biasing the cell 700 in accordance with the voltages given in table 800 shown in FIG. 8A. All values in table 800 are given in volts (V).

In the table 800, "Prog-SSI" indicates programming by a source side injection mechanism, "WL sel" refers to a wordline connected to a selected memory cell, "SG sel" refers to the select gate of the selected memory cell, "BL sel" refers to a bitline coupled to a first source/drain region of the selected memory cell, which may be proximate to the select structure of the selected memory cell, "CL sel" refers to a control line coupled to a second source/drain region of the selected memory cell, which may be distant from the select structure of the selected memory cell, "WL uns" refers to a wordline connected to an unselected memory cell, "SG uns" refers to the select gate of an unselected memory cell, "BL uns" refers to a bitline connected to a first source/drain region of an unselected memory cell, which may be proximate to the select structure of the unselected memory cell, "CL uns" refers to a control line connected to a second source/drain region of an unselected memory cell, which may be distant from the select structure of the unselected memory cell, and "MW" refers to a matrix well (that is a well, in which the flash cell array may be located) or, alternatively, to the substrate, wherein a bitline may in each case be connected to the first source/drain region of a memory cell.

By biasing the memory cell 700 applying the voltages given in columns "WL sel", "SG sel", "BL sel", "CL sel" and "MW" to the corresponding regions or terminals of the cell 700, memory cell 700 may be programmed. In particular, due to the voltage difference of 4-5 volts between the second source/drain region 203 (which may be biased with the voltage given in column "CL sel") and the first source/drain region 202 (which may be biased with the voltage given in column "BL sel" i.e., 0 V), electrons may be accelerated towards the second source/drain region 203 and may be injected into the floating gate 211 due to the high positive voltage (10 volts) applied to the wordline 212. By means of the select gate voltage (1.5 volts), clearly the transistor formed by the first and second source/drain regions 202, 203 and the select gate 221 may be enabled to conduct current so that the memory cell 700 may be programmed.

By biasing other (unselected) memory cells in the memory cell arrangement 700' applying the voltages given in columns "WL uns", "SG uns", "BL uns", "CL uns", and "MW" to the corresponding regions or terminals of these cells (for example, using a program circuit), impacts of these memory cells on the program operation or vice versa may be reduced or eliminated.

The control circuit 750 (e.g., an erase circuit of the control circuit 750 in accordance with an embodiment) may be configured to control the memory cell 700 such that the charge storing memory cell structure 210 (that is, the floating gate memory cell structure in accordance with this embodiment) is erased such that charge carriers (e.g., electrons) stored in the charge storing memory cell structure 210 (that is, in the floating gate 211 of the floating gate memory cell structure in accordance with this embodiment) are drained via at least the first doping well 231, as is illustrated by arrow 771 in FIG. 7.

In accordance with some embodiments, erasing of the memory cell 700 may be achieved by biasing the cell 700 using the voltages given in either row 851 or row 852 of table 850 shown in FIG. 8B. All values in table 850 are given in volts (V).

Rows 851 and 852 in table 850 represent two different sets of erase biasing voltages in accordance with two different embodiments, referred to as "Erase FN GD" and "Erase FN HV", respectively, wherein "Erase FN" indicates erasing by means of a Fowler-Nordheim mechanism. "GD" refers to an embodiment, in which a voltage (also referred to as inhibit voltage) applied to the wordline connected to an unselected memory cell (WL uns) is lower than a voltage applied to the matrix well (MW) or substrate. This erase mechanism may also be referred to as a "partial inhibit" or "partially inhibited erase" as there may be only a small positive voltage on unselected wordlines thereby only partially inhibiting a well disturb induced by the positive well voltage during erase. "HV" refers to an embodiment, in which the voltage applied to the wordline connected to the unselected memory cell (i.e., the inhibit voltage) is substantially equal to the voltage applied to the matrix well or substrate. This erase mechanism may also be referred to as a "full inhibit" or "fully inhibited erase" as the unselected wordline(s) may have about the same potential as the well (or wells).

By biasing the memory cell 700 applying the voltages given in columns "WL sel", "SG sel", "BL sel", "CL sel", and "MW" to the corresponding regions or terminals of the cell 700, memory cell 700 may be erased. In particular, due to the large voltage difference of, e.g., 17 volts (=6 V–(–11 V)) between the matrix well (or the substrate 201) and the wordline 212, electrons stored in the floating gate 211 of the floating gate memory cell structure 210 may escape the floating gate 211 via a Fowler-Nordheim tunneling mechanism towards the substrate 201 and may be drained via the first doping well 231, and further via the second doping well 232 and the substrate 201 such that the memory cell 700 may be erased. In other words, electrons stored in the floating gate 211 may tunnel through an electrically insulating layer disposed between the floating gate 211 and the first doping well 231 into the substrate 201 (that is, into the first doping well 231 arranged within the substrate 201). During the erase operation, the first source/drain region 202 and the second source/drain region 203 of the (selected) cell 700 may be biased with the same voltage (e.g., about 6 volts, as shown in table 850 ("BL sel" and "CL sel")) as the matrix well (MW)

or substrate. In an alternative embodiment, the source/drain regions 202, 203 may be left floating during the erase operation.

By biasing other (unselected) memory cells in the memory cell arrangement 700' applying the voltages given in columns "WL uns", "SG uns", "BL uns", "CL uns", and "MW" to the corresponding regions or terminals of these cells (using, for example, the control circuit 750, e.g., an erase circuit of the control circuit 750 in accordance with one embodiment), impacts of these memory cells on the erase operation or vice versa may be reduced or eliminated.

In accordance with the embodiment represented by the biasing voltages given in row 851 of table 850, a small positive voltage (also referred to as an inhibit voltage) of, e.g., about 1.5 volts may be applied to each wordline connected with an unselected cell in the memory cell arrangement 700'. In other words, an inhibit voltage that is lower than the voltage applied to the matrix well or substrate may be applied to the wordlines of unselected cells. Furthermore, a voltage of about 1.5 volts may be applied to the select gate of each unselected cell in this case.

In accordance with the embodiment represented by the biasing voltages given in row 852 of table 850, the same voltage (or substantially the same voltage) as applied to the well or to the substrate (e.g., about 6 volts as shown in table 850) may be applied to each wordline connected with an unselected cell.

In accordance with the embodiment illustrated in FIG. 7 and FIG. 8B, an erase operation of a selected memory cell (e.g., cell 700 shown in FIG. 7) of the memory cell arrangement 700' may be achieved by means of a Fowler-Nordheim well erase mechanism, in which the overall voltage may be split between the wordline (WL) 212 and a well (e.g., the first doping well 231) or the substrate 201.

In accordance with some embodiments, a page erase may be achieved in the memory cell arrangement 700' by inhibiting unselected wordlines with either a so-called "partial inhibit" (using, e.g., the biasing voltages given in row 851 of table 850), wherein a small positive voltage (e.g., 1.5 V) may be applied to unselected wordlines, or a so-called "full inhibit" (using, e.g., the biasing voltages given in row 852 of table 850), wherein the same voltage is applied to both the unselected wordlines and the well (or the substrate) (e.g., 6 V).

In accordance with one embodiment, in case that a partial inhibit is used, the voltage applied to the selected wordline and the voltage applied to the unselected wordline(s) may be chosen in such a manner that the sum of these voltages remains below a certain threshold (which may be, for example, in the range from about 12 volts to about 13 volts). This may have, for example, the effect that peripheral devices may not need to be changed. In other words, high-voltage (HV) devices may not be needed in the wordline periphery.

FIG. 9 shows exemplary erase biasing voltages applied to a memory cell 900 of a memory cell arrangement in accordance with another embodiment. The biasing voltages may be applied by means of a control circuit (e.g., an erase circuit of the control circuit in accordance with an embodiment) (not shown in FIG. 9 for simplicity, see e.g., FIG. 2) coupled with the memory cell (or with respective regions or terminals of the memory cell 900). The memory cell 900 has a triple-well structure including a first doping well 931 (configured as a p-well in accordance with this embodiment) and a second doping well 932 (configured as an n-well in accordance with this embodiment) formed in a substrate 901 (configured as a p-substrate in accordance with this embodiment) of the memory cell arrangement. The first doping well 931 is formed within the second doping well 932. Furthermore, the memory cell 900 includes n+ doped first and second source/drain regions 202, 203 formed within the first doping well 931. Furthermore, the memory cell 900 includes a charge storing memory cell structure 210 and a select structure 220 formed above the first doping well 931 and between the first source/drain region 202 and the second source/drain region 203.

The charge storing memory cell structure 210 is configured as a floating gate memory cell structure and includes a floating gate (FG) 211 that is formed above the first doping well 931 (the floating gate 211 may also partially overlap the second source/drain region 203, as is shown in FIG. 9) and electrically insulated from the first doping well 931 (e.g., by means of a gate dielectric, not shown in FIG. 9). The charge storing memory cell structure 210 further includes a wordline (WL) 212 that is formed above the floating gate 211 and electrically insulated from the floating gate 211 (e.g., by means of an insulating layer).

The select structure 220 includes a select gate (SG) 221 that is configured as a sidewall spacer adjacent to the charge storing memory cell structure 210 and electrically insulated therefrom (e.g., by means of an insulating layer).

The substrate 901 is kept at zero voltage (0 V), and a voltage of about +6 V is applied to both the first doping well 931 and the second doping well 932, and further to the first source/drain region 202 and the second source/drain region 203 of the cell 900. In an alternative embodiment, the source/drain regions 202, 203 may be left floating. A zero voltage (0 V) is applied to the select gate 221, and a voltage of about −11 V is applied to the wordline 212. The cell 900 may be erased by means of a Fowler-Nordheim well erase mechanism, that is, tunneling of electrons stored in the floating gate 211 (alternatively, in a charge trapping layer) into the first doping well 931 such that the electrons are drained via the first doping well 931 arranged within the second doping well 932.

FIG. 10 shows exemplary erase biasing voltages applied to a memory cell 1000 of a memory cell arrangement in accordance with another embodiment. The biasing voltages may be applied by means of a control circuit (e.g., an erase circuit of the control circuit in accordance with an embodiment) (not shown in FIG. 10 for simplicity, see e.g., FIG. 3) coupled with the memory cell (or with respective regions or terminals of the memory cell 1000). The memory cell 1000 differs from the memory cell 900 shown in FIG. 9 in that it has a quadruple-well structure including a first doping well 1031, a second doping well 1032 and a third doping well 1033 arranged within a substrate 1001, wherein the charge storing memory cell structure 210 is arranged in or above the first doping well 1031. The first doping well 1031 is arranged within the second doping well 1032, and the second doping well 1032 is arranged within the third doping well 1033. In accordance with this embodiment, the first doping well 1031 and the third doping well 1033 are p-doped, while the second doping well 1032 and the substrate are n-doped. The substrate is kept at zero voltage (0 V), and the first, second and third doping wells 1031, 1032, 1033 are biased to about +6 V. The voltages applied to the source/drain regions 202, 203, and to the select gate 221 and to the wordline 212 may be similar or the same as those applied to the memory cell 900 in FIG. 9, as shown in FIG. 10. The cell 1000 may be erased by a Fowler-Nordheim well erase process, in which electrons stored in the charge storing memory cell structure 210 (that is, in the floating gate 211 in accordance with this embodiment) may tunnel into the first doping well 1031 (as shown by the arrows 1071 in FIG. 10) and may thus be drained via the first doping well 1031 arranged within the substrate 1001.

In accordance with some embodiments, memory cells having an arbitrary number of doping wells may be used (e.g., double-well structure, triple-well structure, quadruple-well structure, etc.) and may be programmed and/or erased in a similar manner as described herein above. In particular, the cells may be erased by means of a Fowler-Nordheim well erase mechanism as described herein above.

Figure 11:
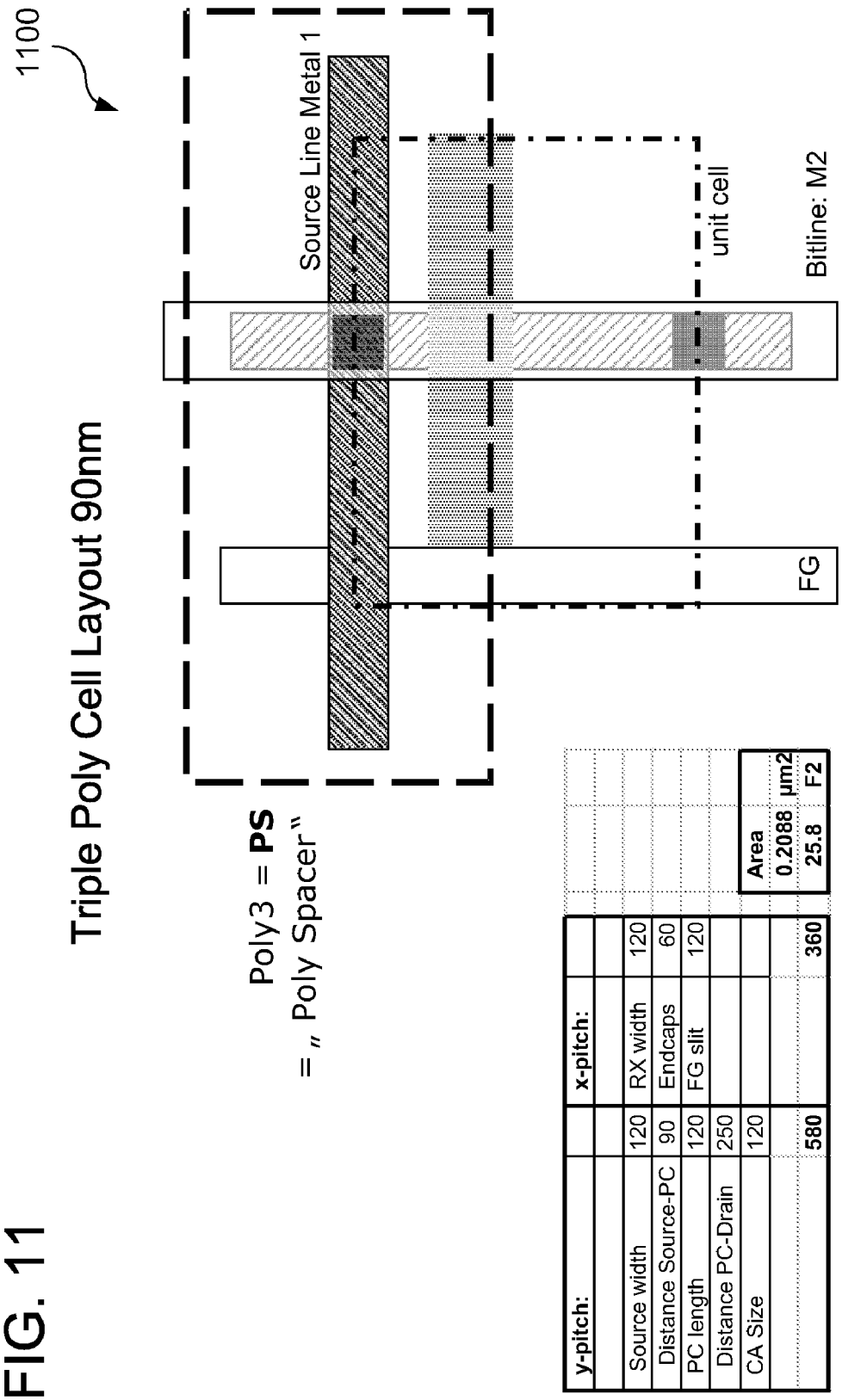
FIG. 11 shows an exemplary layout of a memory cell in accordance with another embodiment.

FIG. 11 shows an exemplary layout 1100 ("Triple Poly Cell Layout 90 nm") of a memory cell for the 90-nm technology node in accordance with an embodiment. The resulting cell area is about 0.2 µm². In the layout 1100 in accordance with this embodiment, a control line (referred to as source line in the layout 1100) connecting to the cell is located in the M1 (Metal 1) metallization level, and a bitline connecting to the cell is located in the M2 (Metal 2) metallization level. A wordline and/or select gate (SG) wiring may be arranged in the M3 (Metal 3) metallization level (not shown in FIG. 11). Furthermore, a M4 (Metal 4) metallization may not be needed in accordance with this embodiment.

In accordance with other embodiments, cell layouts may be realized for other technologies, e.g., other technology nodes. In accordance with some embodiments, these cell layouts may be similar to the cell layout shown in FIG. 11 but may, for example, have different dimensions for the individual cell structures or elements and/or may have a different cell area.

Figure 12A:
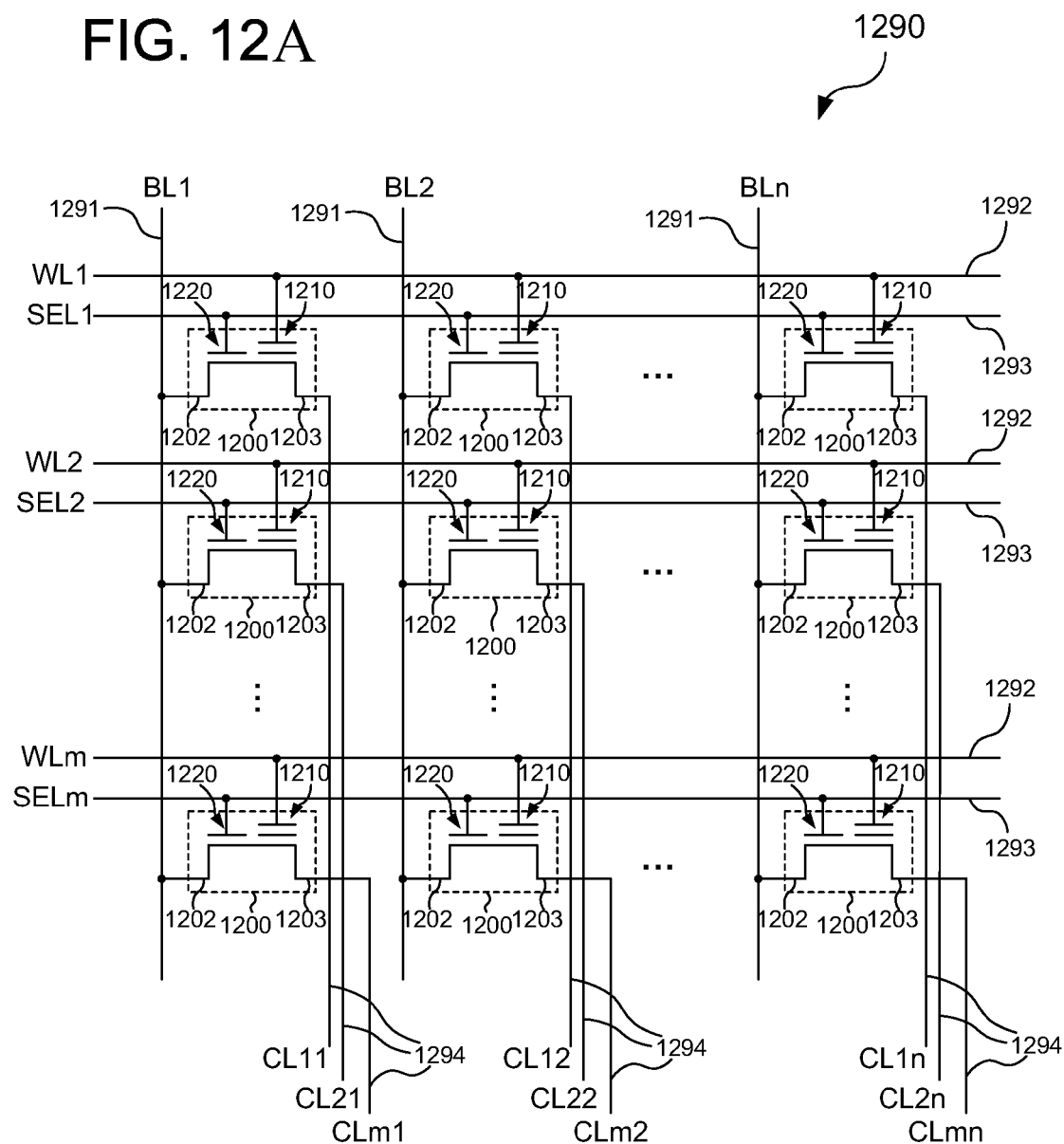
FIG. 12A shows a memory array in accordance with another embodiment.

FIG. 12A shows a memory array 1290 in accordance with an embodiment.

The memory array 1290 includes a plurality of memory cells 1200. Each memory cell 1200 includes a charge storing memory cell structure 1210, a select structure 1220, a first source/drain region 1202 and a second source/drain region 1203. The first source/drain region 1202 is located proximate to the select structure 1220, and the second source/drain region 1203 is located proximate to the charge storing memory cell structure 1210 and distant from the select structure 1220.

In accordance with an embodiment, the memory cells 1200 may be arranged in a rectangular m×n array with m rows and n columns (m and n integer), as shown in FIG. 12A. In accordance with an embodiment, the number of rows (i.e., m) and the number of columns (i.e., n) may be equal (m=n). However, in accordance with an alternative embodiment, the number of rows may be different from the number of columns. Only nine memory cells 1200 of the m×n array are shown in FIG. 12A for illustrative purposes. However, it will be readily understood that the memory array 1290 generally may include a much larger number of memory cells 1200.

The memory array 1290 further includes a plurality of bitlines 1291, wherein each bitline 1291 is coupled to the first source/drain regions 1202 of at least two memory cells 1200. In accordance with an embodiment, the memory array 1290 may include n bitlines 1291 (BL1, BL2, . . . , BLn), wherein a bitline 1291 in each case is provided for a column of memory cells 1200 in the array 1290. In other words, a first bitline BL1 is assigned to the first column of memory cells 1200, a second bitline BL2 is assigned to the second column of memory cells 1200, etc., and an n-th bitline BLn is assigned to the n-th column of memory cells 1200 in the memory array 1290, wherein the first source/drain regions 1202 of all the memory cells 1200 in the first column are all coupled to the first bitline BL1, the first source/drain regions 1202 of all the memory cells 1200 in the second column are all coupled to the second bitline BL2, etc., and the first source/drain regions 1202 of all the memory cells 1200 in the n-th column are all coupled to the n-th bitline BLn.

Clearly, in accordance with an embodiment the first/source drain regions 1202 of all memory cells 1200 in a column may all be coupled to a common bitline. In other words, those source/drain regions of the memory cells 1200 that are located proximate to the select structure 1220 of the respective cell may be tied to a common bitline, such that the electric potentials at these source/drain regions may be controlled via a single bitline (i.e., the common bitline).

In accordance with some embodiments, the memory cells 1200 may be configured in accordance with one of the embodiments described herein above. For example, in accordance with one embodiment, the select structure 1220 may include a spacer structure, including, e.g., a select gate configured as a spacer and laterally disposed from a sidewall of the charge storing memory cell structure 1210, as described herein above. In accordance with alternative embodiments, though, the select structure 1220 may have a different structure. In accordance with another embodiment, a memory cell 1200 may include a substrate, a first doping well and at least one additional doping well arranged within the substrate, wherein the charge storing memory cell structure is arranged in or above the first doping well, and the first doping well is arranged within the at least one additional doping well. In accordance with one embodiment, the at least one additional doping well may include a single doping well (second doping well) such that the memory cell 1200 has a triple-well structure, as described herein above. In accordance with another embodiment, the at least one additional doping well may include a second doping well arranged within a third doping well, such that the memory cell 1200 has a quadruple-well structure, as described herein above. In accordance with other embodiments, the memory cell may 1200 may have a different structure, that is a structure with a different number of wells.

In accordance with some embodiments, the charge storing memory cell structure 1210 may be configured as a non-volatile charge storing memory cell structure, for example as a floating gate memory cell structure or as a charge trapping memory cell structure in accordance with one embodiment, as described herein above. In one embodiment, the charge storing memory cell structure 1210 may be configured as a floating gate memory cell structure and may include a floating gate and a control gate arranged at least partially above the floating gate, as described herein above. In another embodiment, the charge storing memory cell structure 1210 may be configured as a charge trapping memory cell structure and may include a charge trapping layer and a control gate arranged at least partially above the charge trapping layer, as described herein above.

In accordance with another embodiment, the memory array 1290 may include control circuitry (including, for example, a control circuit as described herein above) that may be coupled with the plurality of memory cells 1200 and configured to control the memory cells 1200 such that the charge storing memory cell structure 1210 of a memory cell 1200 is programmed or erased by charging or discharging the charge storing memory cell structure 1210 via at least the first doping well. In accordance with an embodiment, the control circuitry may be coupled with the memory cells 1200 via the plurality of bitlines 1291 coupled to the first source/drain regions 1202 of the memory cells 1200, and furthermore via a plurality of wordlines 1292 coupled to the charge storing memory cell structures 1210 of the memory cells 1200, a plurality of select lines 1293 coupled to the select structures 1220 of the memory cells 1200, and a plurality of control lines 1294 coupled to the second source/drain regions 1203 of the memory cells 1200, as shown in FIG. 12A.

In accordance with an embodiment, the memory array 1290 may include m wordlines 1292 (WL1, WL2, . . . , WLm), wherein a wordline 1292 may in each case be coupled to the charge storing memory cell structures 1210 of all the memory cells 1200 in a row of the memory array 1290. In other words, a first wordline WL1 may be coupled to the charge storing memory cell structures 1210 of all the memory cells 1200 in the first row of the memory array 1290, a second wordline WL2 may be coupled to the charge storing memory cell structures 1210 of all the memory cells 1200 in the second row of the memory array 1290, etc., and an m-th wordline WLm may be coupled to the charge storing memory cell structures 1210 of all the memory cells 1200 in the m-th row of the memory array 1290, as shown in FIG. 12A. Clearly, the charge storing memory cell structures 1210 of all the memory cells 1200 in a row may be coupled to a common wordline, in accordance with this embodiment.

In accordance with another embodiment, the memory array 1290 may include m select lines 1293 (SEL1, SEL2, ..., SELm), wherein a select line 1293 may in each case be coupled to the select structures 1220 of all the memory cells 1200 in a row of the memory array 1290. In other words, a first select line SEL1 may be coupled to the select structures 1220 of all the memory cells 1200 in the first row of the memory array 1290, a second select line SEL2 may be coupled to the select structures 1220 of all the memory cells 1200 in the second row of the memory array 1290, etc., and an m-th select line SELm may be coupled to the select structures 1220 of all the memory cells 1200 in the m-th row of the memory array 1290, as shown in FIG. 12A. Clearly, the select structures 1220 of all the memory cells 1200 in a row may be coupled to a common select line, in accordance with this embodiment.

In accordance with one embodiment, the memory array 1290 may include m×n control lines 1294 (CL<ij>, i=1, 2, 3, ..., m; j=1, 2, 3, ..., n), wherein a control line 1294 may in each case be coupled to the second source/drain region 1203 of a memory cell 1200 of the memory array 1290. In accordance with this embodiment, the second source/drain region 1203 of each memory cell 1200 in each case is coupled to an individual control line 1294. For example, the memory cell 1200 that is located in the first row and the second column of the memory array 1290 is coupled to control line CL12, the memory cell 1200, that is located in the second row and the first column of the memory array 1290 is coupled to control line CL21, etc. In general, a memory cell 1200 that is located in the i-th row and the j-th column of the memory array 1290 is coupled to control line CL<ij>, as shown in FIG. 12A. Thus, the electric potentials at the second source/drain regions 1203 of all the memory cells 1200 in the array 1290 may be individually controlled.

Figure 12B:
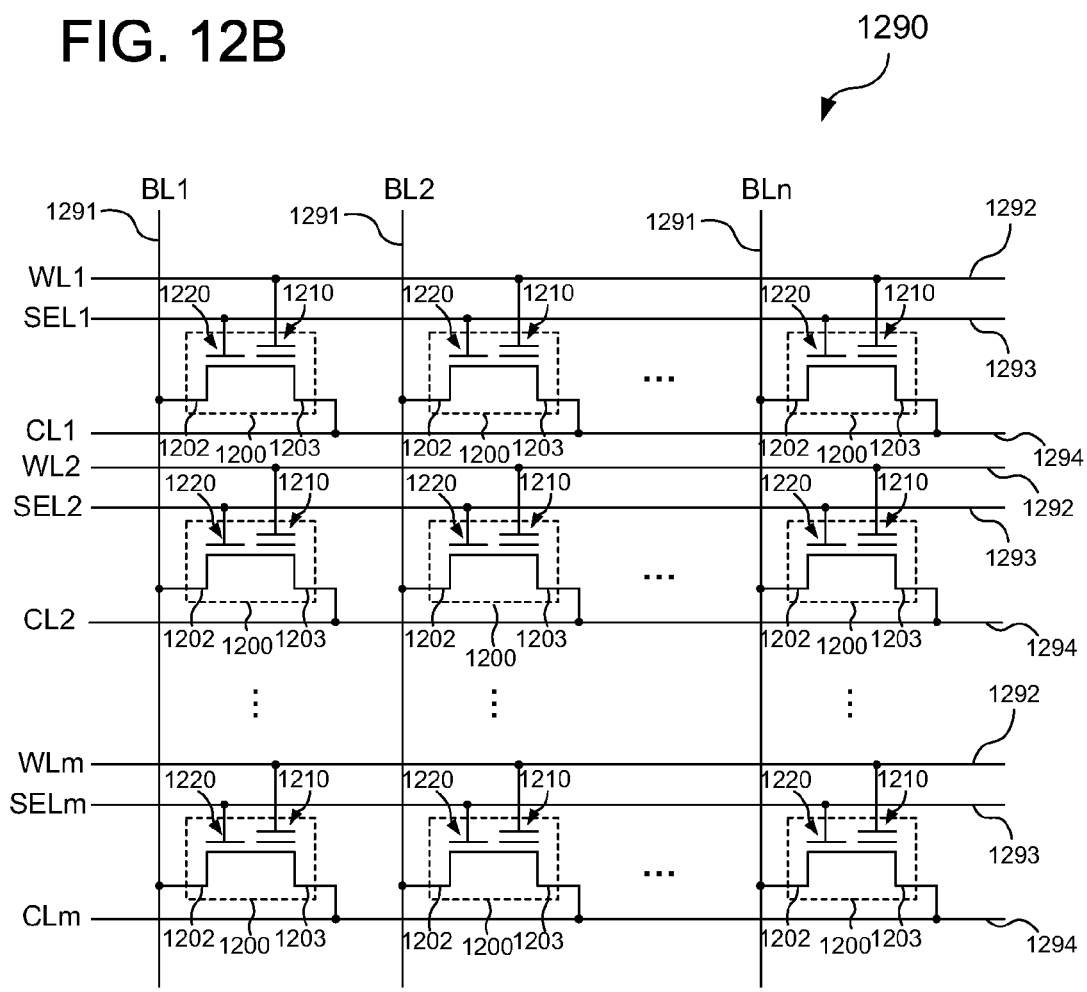
FIG. 12B shows a memory array in accordance with another embodiment.

In accordance with another embodiment, the memory array 1290 may include m control lines 1294 (CL1, CL2, ..., CLm), wherein a control line 1294 may in each case be coupled to the second source/drain regions 1203 of all the memory cells 1200 in a row of the memory array 1290, as is shown in FIG. 12B. That is, a first control line CL1 may be coupled to the second source/drain regions 1203 of all the memory cells 1200 in the first row of the memory array 1290, a second control line CL2 may be coupled to the second source/drain regions 1203 of all memory cells 1200 in the second row of the memory array 1290, etc., and an m-th control line CLm may be coupled to all the memory cells 1200 in the m-th row of the memory array 1290, as is shown in FIG. 12B. Clearly, in accordance with this embodiment, the second source/drain regions 1203 of all the memory cells 1200 in a row may be tied to a common control line, such that the electric potentials at these source/drain regions may be controlled via a single control line (i.e., the common control line).

In accordance with another embodiment, the memory array 1290 may include n control lines, wherein a control line may in each case be coupled to the second source/drain regions 1203 of all the memory cells 1200 in a column of the memory array 1290 (not shown). That is, a first control line may be coupled to the second source/drain regions 1203 of all the memory cells 1200 in the first column of the memory array 1290, a second control line may be coupled to the second source/drain regions 1203 of all memory cells 1200 in the second column of the memory array 1290, etc., and an n-th control line may be coupled to all the memory cells 1200 in the n-th column of the memory array 1290. Clearly, in accordance with this embodiment, the second source/drain regions 1203 of all the memory cells 1200 in a column may be tied to a common control line, in a similar manner as described above for the first source/drain regions 1202, such that the electric potentials at these source/drain regions may be controlled via a single control line (i.e., the common control line).

The memory cells 1200 of the memory array 1290 may be controlled (e.g., programmed and/or erased) by applying appropriate electrical potentials to the bitlines 1291, wordlines 1292, select lines 1293 and control lines 1294 by means of the control circuitry. For example, each of the cells 1200 may be programmed or erased in accordance with one of the embodiments described herein above.

FIG. 13 shows a method 1300 of operating a memory array in accordance with another embodiment. The memory array may include a plurality of memory cells, wherein each memory cell may include a charge storing memory cell structure, a select structure, a first source/drain region arranged proximate to the select structure of the memory cell and a second source/drain region arranged distant from the select structure of the memory cell.

In 1302, a selected memory cell of the plurality of memory cells is programmed by applying a first voltage to the first source/drain region of the selected memory cell, applying a second voltage to the first source/drain region of at least one unselected memory cell of the plurality of memory cells, wherein the second voltage is different from the first voltage, and applying a third voltage to the second source/drain region of the selected memory cell and to the second source/drain region of the at least one unselected memory cell.

In accordance with an embodiment, the second source/drain region of the selected memory cell and the second source/drain region of the at least one unselected memory cell may be tied together. In other words, in accordance with this embodiment, the second source/drain regions of the selected memory cell and the at least one unselected memory cell may be electrically coupled to one another.

In accordance with one embodiment, the memory cells may be arranged in rows and columns in the array.

In accordance with another embodiment, the first voltage may be applied to the first source/drain region of the selected memory cell by means of a bitline coupled to the first source/drain region of the selected memory cell. In accordance with another embodiment, the bitline may be coupled to the first source/drain regions of other memory cells in the memory array. For example, in accordance with one embodiment, the bitline may be coupled to the first source/drain regions of all memory cells in the column, in which the selected memory cell is located. In other words, in accordance with this embodiment, the bitline may be a common bitline coupled to the first source/drain regions of all the memory cells in that column.

The second voltage may be an inhibit voltage that may be applied to the first source/drain region(s) of one or more unselected memory cells in the memory array during programming of the selected memory cell. In accordance with one embodiment, the second voltage may be applied to the first source/drain region(s) of the unselected memory cell(s) by means of a bitline coupled to the first source/drain region(s) of the unselected memory cell(s). In accordance with another embodiment, the bitline may be coupled to the first source/drain regions of other memory cells in the memory array. For example, in accordance with one embodiment, the bitline may be coupled to the first source/drain regions of all memory cells in the column(s), in which the unselected memory cell(s) is (are) located. In other words, in accordance with this embodiment, the bitline may be a common bitline coupled to the first source/drain regions of all the memory cells in that column.

In accordance with an embodiment, the second source/drain region(s) of the unselected memory cell(s) and the second source/drain region of the selected memory cell may be tied together, in other words electrically coupled to one another. Thus, a control voltage or potential (i.e., the third voltage) may be applied to the second source/drain regions of both the selected memory cell and the unselected memory cell(s) during programming of the selected memory cell.

In accordance with an embodiment, the control voltage may be applied by means of a control line that is coupled to the second source/drain region of the selected memory cell and to the second source/drain region(s) of the unselected memory cell(s).

In accordance with another embodiment, the control line may be coupled to the second source/drain regions of all the memory cells located in the row, in which the selected memory cell is located. In other words, in accordance with this embodiment, the control line may be a common control line coupled to the second source/drain regions of the memory cells in that row.

In accordance with an embodiment, the second voltage (i.e., the inhibit voltage) may have about the same value as the third voltage (i.e., the control voltage), while the first voltage may be different, e.g., lower than, the second and third voltages.

In accordance with an embodiment, the memory cells may be configured in accordance with one of the embodiments described herein.

Figure 14:
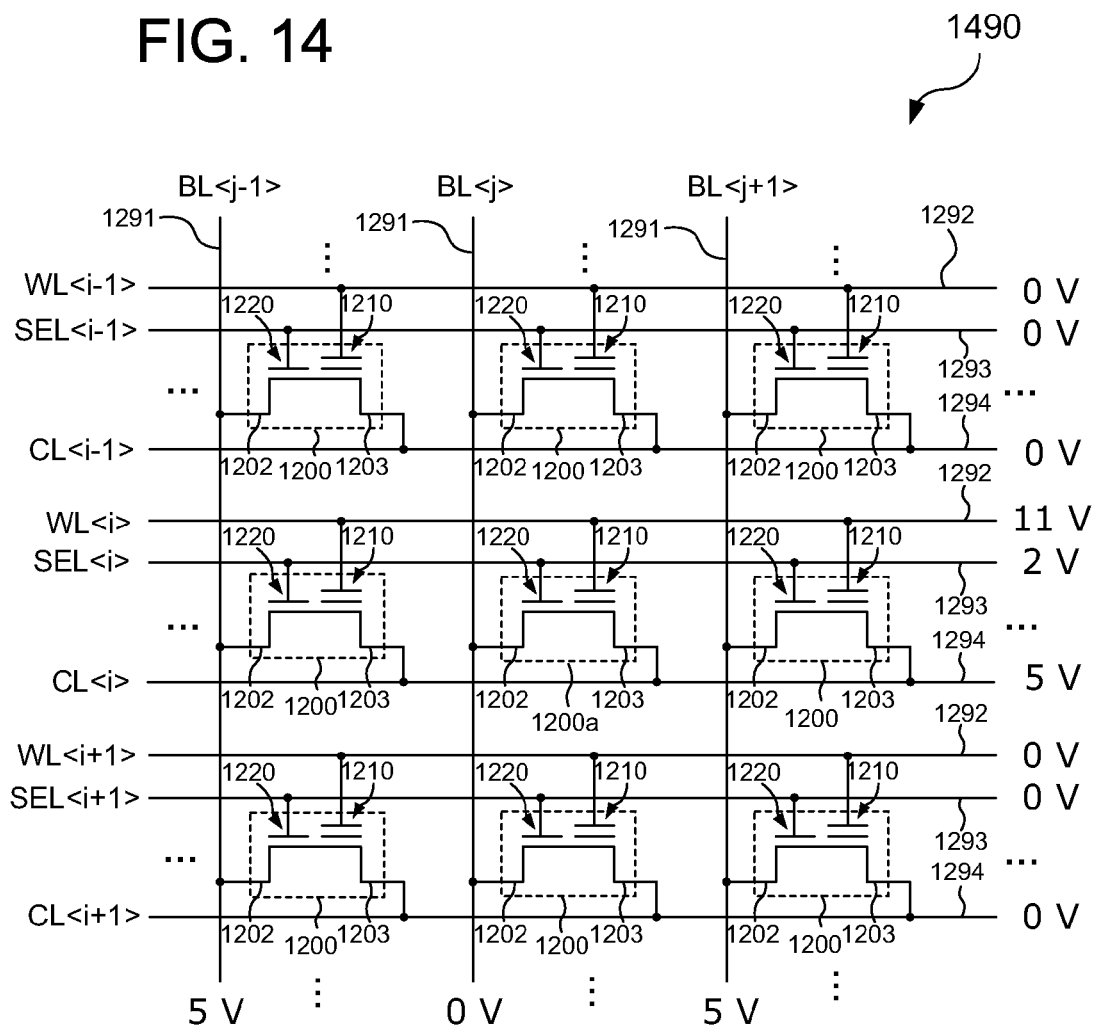
FIG. 14 shows an operating scheme for a memory array in accordance with another embodiment.
Figure 15:
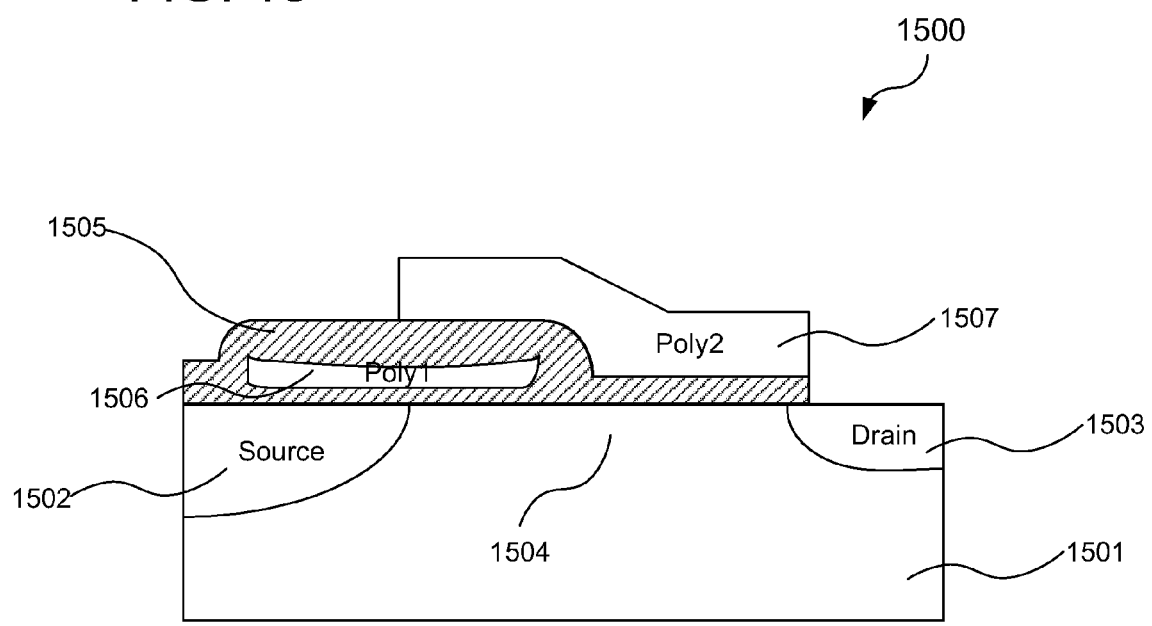
FIG. 15 shows a conventional flash memory cell.

FIG. 14 shows an operating scheme for a memory array 1490 in accordance with another embodiment. The memory array 1490 includes a plurality of memory cells 1200 arranged in rows and columns and coupled to bitlines 1291, wordlines 1292, select lines 1293 and control lines 1294 in a similar manner as the memory array 1290 in accordance with the embodiment shown in FIG. 12B. In accordance with one embodiment, the memory cells 1200 may be configured in accordance with one of the embodiments described herein. Only a section of the memory array 1490, namely the memory cells 1200 located at the crosspoints of rows i−1, i, i+1 with columns j−1, j and j+1 of the array 1490, is shown in FIG. 14. Each memory cell 1200 includes a charge storing memory cell structure 1210, a select structure 1220, a first source/drain region 1202 arranged proximate to the select structure 1220, and a second source/drain region 1203 arranged distant from the select structure 1220.

In accordance with the embodiment shown, the first source/drain regions 1202 of all memory cells 1200 in a column are coupled to a common bitline 1291, and the second source/drain regions 1203 of all memory cells 1200 in a row are coupled to a common control line 1294. For example, the first source/drain regions 1202 of all memory cells 1200 in the (j−1)-th column are coupled to a common bitline BL<j−1>, and the second source/drain regions 1203 of all memory cells 1200 in the (i−1)-th row are coupled to a common control line CL<i−1>, as shown in FIG. 14.

Furthermore, in accordance with the embodiment shown, the charge storing memory cell structures 1210 of all memory cells 1200 in a row are coupled to a common wordline 1292, and the select structures 1220 of all memory cells 1200 in a row are coupled to a common select line 1293. For example, the charge storing memory cell structures 1210 of all memory cells 1200 in the (i−1)-th row are coupled to a common wordline WL<i−1>, and the select structure 1220 of all memory cells 1200 in the (i−1)-th row are coupled to a common select line SL<i−1>.

In accordane with the embodiment shown, a zero voltage (0 V) is applied to the second source/drain regions 1203 of all memory cells 1200 in the (i−1)-th row and to all memory cells 1200 in the (i+1)-th row by means of the control lines CL<i−1> and CL<i+1>, respectively. Furthermore, a zero voltage (0 V) is applied to to the charge storing memory cell structures 1210 of all memory cells 1200 in the (i−1)-th row and to all memory cells 1200 in the (i+1)-th row by means of the wordlines WL<i−1> and WL<i+1>, respectively. Furthermore, a zero voltage (0 V) is applied to the the select structures 1220 of all memory cells 1200 in the (i−1)-th row and to all memory cells 1200 in the (i+1)-th row by means of the select lines SEL<i−1> and SEL<i+1>, respectively.

In accordance with another embodiment, a zero voltage (0 V) may also be applied to at least one one of control lines CL<i±k>, wordlines WL<i±k>, and select lines SEL<i±k> (k=2, 3, 4, . . . , etc.).

In the embodiment shown, the memory cell 1200a located at the crosspoint of the i-th row with the j-th column, that is, the memory cell 1200a coupled to bitline BL<j>, wordline WL<i>, select line SEL<i> and control line CL<i>, is programmed by applying appropriate electrical potentials or voltages to the respective terminals of the memory cell 1200a. The memory cell 1200a will also be referred to as a selected memory cell in the following.

In accordance with an embodiment, a zero voltage (0 V) may be applied to bitline BL<j>, which is coupled to the first source/drain region 1202 of the selected memory cell 1200a, a voltage of about 11 volts may be applied to wordline WL<i>, which is coupled to the charge storing memory cell structure 1210 (e.g., to a control gate) of the selected memory cell 1200a, a voltage of about 2 volts may be applied to select line SEL<i>, which is coupled to the select structure 1220 of the selected memory cell 1200a, and a voltage of about 5 volts may be applied to control line CL<i>, which is coupled to the second source/drain region 1203 of the selected memory cell 1200a, as shown in FIG. 14.

By means of applying the above-described potentials to the respective terminals of the selected memory cell 1200a, the memory cell 1200a may be programmed. For example, charge carriers (e.g., electrons) may be accelerated from the first source/drain region 1202 towards the second source/drain regions 1203 of the selected memory cell 1202a due to the potential difference of 5 volts (=5 V−0 V) between the first and second source/drain regions 1202, 1203, and may further be accelerated towards the charge storing memory cell structure 1210 that is coupled to the wordline WL<i> with 11 volts potential, such that the charge storing memory cell structure may be charged with the charge carriers (e.g., electrons) and thus programmed. In accordance with alternative embodiments, other voltages may be used for programming the selected memory cell 1200a.

As bitline BL<j> is a common bitline that is coupled to the first source/drain regions 1202 of all memory cells 1200 in the j-th column, these first source/drain regions 1202 will have about the same potential (clearly, 0 V in accordance with the embodiment shown) during programming of the selected memory cell 1200a. Similarly, as control line CL<i> is a common control line that is coupled to the second source/drain regions 1203 of all memory cells 1200 in the i-th row, these second source/drain regions 1203 will have about the same potential during programming of the selected memory cell 1200a.

Furthermore, in accordance with the embodiment shown, a voltage of about 5 volts is applied to bitline BL<j−1> and thus to the first source/drain regions 1202 of all memory cells 1200 in the (j−1)-th column. This voltage may be referred to as an inhibit voltage and may serve to inhibit or prevent programming of an unselected memory cell 1200 located at the crosspoint of the i-th row and the (j−1)-th column, that is clearly the left neighbor cell of the selected memory cell 1200a in the same row. Similarly, an inhibit voltage of about 5 volts is applied to bitline BL<j+1> and thus to the first source/drain regions 1202 of all memory cells 1200 in the (j+1)-th column. This voltage may serve to inhibit or prevent programming of an unselected memory cell 1200 located at the crosspoint of the i-th row and the (j+1)-th column, that is clearly the right neighbor cell of the selected memory cell 1200a in the same row.

In accordance with another embodiment, the inhibit voltage applied to the first source/drain regions 1202 of the unselected memory cells 1200 may have a value that is different from 5 volts. For example, in accordance with one embodiment, the inhibit voltage may have approximately the same value as the voltage that is applied to the control line that is coupled to the selected memory cell.

In accordance with another embodiment, an inhibit voltage may also be applied to at least one of bitlines BL<j±k> (k=2, 3, 4, . . . ) in order to inhibit or prevent programming of an unselected memory cell 1200 located at the crosspoint of the i-th row and the (j±k)-th column, that is clearly the k-th next neighbor cell to the left or right of the selected memory cell 1200a in the same row.

One effect of the operating scheme illustrated in FIG. 14 can be seen in that by applying an inhibit voltage to one or more bitlines coupled with unselected memory cells, a program gate disturb in these unselected memory cells (in other words, a gate disturb that may occur in an unselected memory cell during programming of a selected memory cell) may be reduced or at least partially eliminated. Thus, using the operating scheme as described above in a memory array, the yield may, for example, be increased.

In the following, additional features and potential effects of illustrative embodiments are discussed.

In accordance with some embodiments, a memory cell concept is described that may be optimized for minimum module area overhead and high endurance, and that may be integrated in a standard 1-transistor (1 T) stacked gate technology in a modular way. In accordance with some embodiments, the memory cell concept may be applied to a flash memory cell architecture.

A memory cell in accordance with some embodiments includes a select gate that may be realized in a spacer technique. In accordance with one embodiment, the select gate may be realized as a polysilicon spacer that may be formed at a sidewall of a 1-transistor (1 T) stacked gate cell. In accordance with one embodiment, the sidewall may face a source/drain region of the memory cell that is coupled to a common bitline. That is, in accordance with this embodiment, the select gate (or spacer select gate) may be oriented towards a source/drain region of the memory cell where a bitline contact of the cell may be. In other words, a source/drain region of the cell that is proximate to the select gate may be coupled to a common bit line. This orientation of the select gate may lead to improved disturb behavior or conditions of the cell. For example, in accordance with one embodiment, a program gate disturb (e.g., a Fowler-Nordheim gate disturb) may be reduced by a positive programming voltage applied to the source/drain region that is distant from the select gate.

In a memory cell arrangement in accordance with another embodiment, a program mechanism or programming of at least one memory cell may be realized by source side injection (SSI).

In a memory cell arrangement in accordance with another embodiment, an erase mechanism or erasing of at least one memory cell may be realized by Fowler-Nordheim (FN) well erase.

In accordance with one embodiment, the combination of these three techniques may allow for a very robust cell concept, which may be realized with low complexity on module design and thereby with low module area overhead.

In accordance with one embodiment, the use of a Fowler-Nordheim erase operation may improve retention after cycling performance, for example compared to a hot hole erase (HHE) operation.

In accordance with some embodiments, a memory cell arrangement is provided that includes at least one memory cell, wherein the memory cell may be particularly optimized on low module area overhead.

In accordance with some embodiments, voltages used in a memory cell arrangement (e.g., during write, erase or read operations) may all be below 12 V. This may be beneficial with respect to higher voltage devices in terms of area consumption.

In accordance with some embodiments, the select gate of a memory cell may be realized as a spacer. Thus, alignment problems may be reduced or avoided and/or no source underdiffusion may be necessary for coupling to the floating gate.

In accordance with some embodiments, a low number of charge pumps may be used.

In accordance with some embodiments, an overerase handling may be avoided due to the 2-transistor (2 T) construction (split gate concept).

In accordance with some embodiments, a higher write/erase endurance may be achieved as no field enhanced poly/poly erase (as used, e.g., by the conventional ESF-1 cell) is used.

In accordance with some embodiments, a lower number of wordlines may be used as a separate erase gate may be avoided.

In accordance with some embodiments, process integration may be much easier as there is no tunnelling through the sidewall oxide.

In accordance with some embodiments, the cells in a memory cell arrangement may be arranged or organized in a NOR architecture with a common source connection.

In accordance with some embodiments, page erase may be realized in the cell arrangement. By a page erase, only selected wordlines may be erased. If page erase functionality is provided, the common source may be realized in page granularity, in accordance with one embodiment.

In accordance with some embodiments, an erase operation of a selected memory cell of a memory cell arrangement may be achieved by means of a Fowler-Nordheim well erase mechanism, in which the overall voltage may be split between the wordline and a well (or the substrate) in or on which the cell is formed.

In a memory cell arrangement in accordance with some embodiments, a page erase may be achieved by inhibiting unselected wordlines with either a so-called partial inhibit (using, e.g., the biasing voltages given in row 851 of table 850), wherein a small positive voltage (e.g., +1.5 V) may be applied to unselected wordlines, or a so-called full inhibit (using, e.g., the biasing voltages given in row 852 of table 850), wherein the same voltage may be applied to both the unselected wordlines and the well (or the substrate) (e.g., +6 V).

A memory cell in accordance with one embodiment may have a read current in the range from about 5 μA to about 10 μA, although in accordance with other embodiments, the memory cell may have a read current in a different range, for example including current values less than 5 μA and/or higher than 10 μA in accordance with some embodiments.

A memory cell in accordance with another embodiment may have a floating gate (FG) that may partially overlap a source/drain region of the cell. For example, in accordance with an embodiment, the floating gate may have an overlap in the range from about 5 nm to about 10 nm, although in accordance with other embodiments, the floating gate may have an overlap in a different range, for example including values less than 5 nm and/or higher than 10 nm in accordance with some embodiments.

In a memory cell arrangement in accordance with another embodiment, the voltage difference between selected and unselected wordlines may be kept below about 12 V to 13 V. Thus, peripheral devices may not be changed, for example. In other words, high-voltage (HV) devices may not be needed in the wordline periphery.

A memory cell arrangement in accordance with some embodiments includes a first doping well and at least one additional doping well arranged within the substrate. The first doping well is arranged within the at least one additional doping well. In accordance with one embodiment, during erase operations, only the first doping well and the at least one additional doping well may be biased while source/drain regions of the cell arrangement may be left floating. In an alternative embodiment, the doping wells and source/drain regions may have the same potential.

In accordance with some embodiments, a memory cell concept is provided that may be used, for example, in embedded flash products such as smart cards (e.g., smart cards used in mobile communication (MobCom) devices), automotive microcontrollers (ATV μC's), etc.

In accordance with some embodiments, a memory cell concept is provided that includes a program mechanism by source side injection in combination with Fowler-Nordheim well erase and a select gate realized by a spacer technique. In accordance with some embodiments, the aforementioned features may be combined with a floating gate storage layer as a charge storing means of the memory cell.

In accordance with some embodiments, a memory cell may have a multi-well structure, wherein the individual wells may have alternating doping types. For example, the multi-well structure may include n doping wells (wherein n is an integer number greater than or equal to two) and a doped substrate, wherein the k-th doping well is arranged within the (k+1)-th doping well (for k=1, 2, . . . , n−1) and the n-th doping well is arranged within the substrate. A multi-well structure with two doping wells (n=2) and doped substrate may be referred to as a triple-well structure, a multi-well structure with three doping wells (n=3) and doped substrate may be referred to as a quadruple-well structure (or quattro-well structure), a multi-well structure with four doping wells (n=4) and doped substrate may be referred to as a quintuple-well structure, etc.

In accordance with one embodiment, a method for erasing a charge storing memory cell structure of a memory cell is provided. The memory cell includes a charge storing memory cell structure and a select structure. The charge storing memory cell structure is arranged in or above a first doping well which is arranged within at least one additional doping well. The charge storing memory cell structure is erased such that charge carriers (e.g., electrons) stored in the charge storing memory cell structure are drained via at least the first doping well.

A memory array in accordance with another embodiment includes a plurality of memory cells arranged in rows and columns. Each memory cell includes a charge storing memory cell structure, a select structure, a first source/drain region arranged proximate to the select structure, and a second source/drain region arranged distant from the select structure. In accordance with an embodiment, the select structure may include a select gate configured as a spacer and laterally disposed from a sidewall of the charge storing memory cell structure. In accordance with another embodiment, the charge storing memory cell structure may be configured as a floating gate memory cell structure and may, for example, include a floating gate and a control gate. In accordance with an embodiment, the first source/drain regions (i.e., the source/drain regions proximate to the select structure) of all memory cells in a column may be coupled to a common bitline. In other words, the first source/drain regions of all memory cells in a column may be tied together, in other words electrically coupled to one another. In accordance with another embodiment, the second source/drain regions (i.e., the source/drain regions distant from the select structure) of all memory cells in a row may be coupled to a common control line. In other words, the second source/drain regions of all memory cells in a row may be tied together, in other words electrically coupled to one another. In accordance with another embodiment, a common control line may run in parallel to a wordline that is coupled to all the memory cells in a row. In accordance, with another embodiment, a common bitline may run perpendicular to the wordline. In accordance with another embodiment, a programming voltage may be fed to a selected memory cell from the common control line, which is running in parallel to the wordline. In other words, in accordance with this embodiment, an electrical potential may be applied to the second source/drain region of the selected memory cell that is higher than an electrical potential applied to the first source/drain region of the selected memory cell. In accordance with another embodiment, an inhibit voltage may be applied to one or more unselected bitlines (in other words, bitlines connected to unselected memory cells) during programming of the selected memory cell. In accordance with an embodiment, the inhibit voltage may have about the same value as the programming voltage applied to the selected memory cell. In accordance with other embodiments, though, the inhibit voltage may have a different value. By means of the inhibit voltage, a gate disturb may, for example, be reduced or prevented in the unselected memory cells.

In accordance with another embodiment, a method of programming a memory cell of a memory array is provided, wherein the memory array includes a plurality of memory cells, each memory cell including a charge storing memory cell structure, a select structure, a first source/drain region arranged proximate to the select structure and a second source/drain region arragend distant from the select structure, and wherein programming a selected memory cell of the memory array includes tying together the second source/drain region of the selected memory cell and the second source/drain region of at least one unselected memory cell to a common first voltage, and applying second and third voltages to the first source/drain regions of the selected memory cell and unselected memory cell, respectively, wherein the second voltage is different from the third voltage.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell arrangement, comprising:
   a substrate;
   at least one memory cell, comprising a charge storing memory cell structure and a select structure;
   a first doping well, a second doping well and a third doping well arranged within the substrate, wherein the charge storing memory cell structure is arranged in or above the first doping well, the first doping well is arranged within the second doping well, and the second doping well is arranged within the third doping well; and
   a control circuit coupled with the memory cell and configured to control the memory cell such that the charge storing memory cell structure is programmed or erased by charging or discharging the charge storing memory cell structure via at least the first doping well, wherein the control circuit comprises an erase circuit that is configured to provide at least one electric potential to the memory cell such that charge carriers stored in the charge storing memory cell structure are drained via at least the first doping well, wherein the erase circuit is configured to provide the same electric potential to the first, second and third doping wells.

2. The memory cell arrangement of claim 1, wherein the select structure comprises a select gate configured as a spacer and laterally disposed from a sidewall of the charge storing memory cell structure.

3. The memory cell arrangement of claim 1, wherein the erase circuit is configured to control the memory cell such that the charge storing memory cell structure is erased according to Fowler-Nordheim erase via at least the first doping well.

4. The memory cell arrangement of claim 1, further comprising at least one additional doping well arranged within the substrate, wherein the third doping well is arranged within the at least one additional doping well.

5. The memory cell arrangement of claim 1, wherein the charge storing memory cell structure is a non-volatile charge storing memory cell structure.

6. The memory cell arrangement of claim 5, wherein the charge storing memory cell structure is a floating gate memory cell structure or a charge trapping memory cell structure.

7. The memory cell arrangement of claim 1, wherein the control circuit comprises a program circuit that is configured to provide at least one electric potential to the memory cell such that charge carriers are introduced into the charge storing memory cell structure via at least the first doping well.

8. The memory cell arrangement of claim 7, wherein the program circuit is configured to control the memory cell such that the charge storing memory cell structure is programmed using a source side injection mechanism.

9. The memory cell arrangement of claim 1, further comprising:
   a first wordline structure coupled with the memory cell and the erase circuit;
   a second wordline structure coupled with another memory cell comprising another charge storing memory cell structure;
   wherein the erase circuit is configured to provide a wordline inhibit voltage to the second wordline and thereby to the other charge storing memory cell structure when erasing the charge storing memory cell structure.

10. The memory cell arrangement of claim 9, wherein the wordline inhibit voltage is substantially equal to a voltage provided to at least one of the first, second and third doping wells.

11. The memory cell arrangement of claim 9, wherein the wordline inhibit voltage is lower than a voltage provided to at least one of the first, second and third doping wells.

12. An electronic device, comprising:
    a logic arrangement comprising at least one logic device;
    a memory cell arrangement, comprising:
    a substrate;
       at least one memory cell, comprising a charge storing memory cell structure and a select structure;
    a first doping well, a second doping well and a third doping well arranged within the substrate, wherein the charge storing memory cell structure is arranged in or above the first doping well, the first doping well is arranged within the second doping well, and the second doping well is arranged within the third doping well; and
    a control circuit coupled with the memory cell and configured to control the memory cell such that the charge storing memory cell structure is programmed or erased by charging or discharging the charge storing memory cell structure via at least the first doping well, wherein the control circuit comprises an erase circuit that is configured to provide at least one electric potential to the memory cell such that charge carriers stored in the charge storing memory cell structure are drained via at least the first doping well, wherein the erase circuit is configured to provide the same electric potential to the first, second and third doping wells.

13. The electronic device of claim 12, wherein the select structure comprises a select gate configured as a spacer and laterally disposed from a sidewall of the charge storing memory cell structure.

14. The electronic device of claim 12, wherein the logic arrangement comprises at least one programmable logic device.

15. The electronic device of claim 12, wherein the control circuit is configured to control the memory cell such that the charge storing memory cell structure is erased according to Fowler-Nordheim erase via at least the first doping well.

16. The electronic device of claim 12, wherein the charge storing memory cell structure is a floating gate memory cell structure.

17. The electronic device of claim 12, configured as a smart card device.

18. A memory cell arrangement, comprising:
    a substrate;
    at least one memory cell comprising a charge storing memory cell structure and a select structure;
    a first doping well, a second doping well and a third doping well arranged within the substrate, wherein the charge storing memory cell structure is arranged in or above the first doping well, the first doping well is arranged within the second doping well, and the second doping well is arranged within the third doping well;

a programming circuit coupled with the memory cell and configured to control the memory cell such that the charge storing memory cell structure is programmed by charging or discharging the charge storing memory cell structure via at least the first doping well; and an erase circuit coupled with the memory cell and configured to provide at least one electric potential to the memory cell such that charge carriers stored in the charge storing memory cell structure are drained via at least the first doping well, wherein the erase circuit is configured to provide the same electric potential to the first, second and third doping wells.

19. The memory cell arrangement of claim 18, wherein the select structure comprises a select gate configured as a spacer and laterally disposed from a sidewall of the charge storing memory cell structure.

20. The memory cell arrangement of claim 18, wherein the erase circuit is configured to control the memory cell such that the charge storing memory cell structure is erased according to Fowler-Nordheim erase via at least the first doping well.

21. The memory cell arrangement of claim 18, wherein the charge storing memory cell structure is a floating gate memory cell structure or a charge trapping memory cell structure.

22. The memory cell arrangement of claim 18, wherein the program circuit is configured to control the memory cell such that the charge storing memory cell structure is programmed using a source side injection mechanism.

23. The memory cell arrangement of claim 18, further comprising:

a first wordline structure coupled with the memory cell and the erase circuit; and a second wordline structure coupled with another memory cell comprising another charge storing memory cell structure;

wherein the erase circuit is configured to provide a wordline inhibit voltage to the second wordline when erasing the charge storing memory cell structure.

24. The memory cell arrangement of claim 23, wherein the wordline inhibit voltage is substantially equal to a voltage provided to at least one of the first, second and third doping wells.

25. The memory cell arrangement of claim 23, wherein the wordline inhibit voltage is lower than a voltage provided to at least one of the first, second and third doping wells.

* * * * *